(12) United States Patent
Shim et al.

(10) Patent No.: US 9,507,059 B2
(45) Date of Patent: Nov. 29, 2016

(54) OPTICAL FILMS FOR REDUCING COLOR SHIFT AND ORGANIC LIGHT-EMITTING DISPLAY APPARATUSES EMPLOYING THE SAME

(71) Applicant: Samsung Electronics Co., Ltd., Suwon-Si, Gyeonggi-Do (KR)

(72) Inventors: Hong-shik Shim, Seoul (KR); Eun-young Cho, Chungcheongnam-do (KR); You-min Shin, Chungcheongnam-do (KR); Eui-soo Kim, Chungcheongnam-do (KR); Chul-ho Jeong, Gwangju-si (KR); Young Oh, Uiwang-si (KR); Hyun-min Kim, Uiwang-si (KR)

(73) Assignees: Samsung Electronics Co., Ltd., Gyeonggi-do (KR); Corning Precision Materials Co., Ltd., Chungcheongnam-do (KR); Cheil Industries Inc., Gyeongsangbuk-do (KR)

( * ) Notice: Subject to any disclaimer, the term of this patent is extended or adjusted under 35 U.S.C. 154(b) by 0 days.

(21) Appl. No.: 14/846,231

(22) Filed: Sep. 4, 2015

(65) Prior Publication Data

US 2016/0077248 A1    Mar. 17, 2016

Related U.S. Application Data

(63) Continuation of application No. 14/089,228, filed on Nov. 25, 2013, now Pat. No. 9,209,230.

(30) Foreign Application Priority Data

Dec. 21, 2012 (KR) .......................... 10-2012-0151338
Jun. 5, 2013 (KR) .......................... 10-2013-0064967

(51) Int. Cl.
*H01L 29/12* (2006.01)
*G02B 5/02* (2006.01)
(Continued)

(52) U.S. Cl.
CPC ........... *G02B 5/0247* (2013.01); *G02B 5/0263* (2013.01); *G02B 5/0278* (2013.01);
(Continued)

(58) Field of Classification Search
CPC . H01L 51/5265; H01L 51/56; H01L 27/326; G02B 5/0215; G02B 5/0221
USPC ...................... 257/40, 43, 76, 87–89, 98–100
See application file for complete search history.

(56) References Cited

U.S. PATENT DOCUMENTS

| 7,960,911 B2 | 6/2011 | Kwon et al. |
| 8,686,433 B2 | 4/2014 | Matsui et al. |

(Continued)

FOREIGN PATENT DOCUMENTS

| EP | 2527882 A1 | 11/2012 |
| EP | 2530514 A1 | 12/2012 |

(Continued)

OTHER PUBLICATIONS

Japanese Patent Office Action, dated Oct. 6, 2015, for Japanese Patent Application No. 2013-264288.

(Continued)

*Primary Examiner* — Dung Le
(74) *Attorney, Agent, or Firm* — Harness, Dickey & Pierce, P.L.C.

(57) ABSTRACT

Optical films, and organic light-emitting display apparatuses employing the same, include a high refractive index pattern layer including a first surface and a second surface facing each other, wherein the first surface includes a pattern having a plurality of grooves. The plurality of grooves each have a curved surface and a depth greater than a width thereof. The high refractive index pattern layer is formed of a material having a refractive index greater than 1. The optical films, and the organic light-emitting display apparatuses, further include a low refractive index pattern layer formed of a material having a refractive index smaller than the refractive index of the material constituting the high refractive index pattern layer. The low refractive index pattern layer includes a filling material for filling the plurality of grooves.

37 Claims, 14 Drawing Sheets

(51) Int. Cl.
*G02B 5/30* (2006.01)
*G02B 5/18* (2006.01)
*G02B 27/28* (2006.01)
*H01L 51/52* (2006.01)
*H01L 27/32* (2006.01)

(52) U.S. Cl.
CPC .......... *G02B5/1871* (2013.01); *G02B 5/3025* (2013.01); *G02B 27/286* (2013.01); *H01L 51/5275* (2013.01); *H01L 51/5281* (2013.01); *G02B 5/0242* (2013.01); *H01L 27/322* (2013.01); *H01L 27/3211* (2013.01); *H01L 51/5265* (2013.01); *H01L 51/5268* (2013.01); *H01L 51/5284* (2013.01)

(56) References Cited

U.S. PATENT DOCUMENTS

| | | |
|---|---|---|
| 2002/0034008 A1 | 3/2002 | Ohishi et al. |
| 2002/0044356 A1 | 4/2002 | Arakawa et al. |
| 2002/0130990 A1* | 9/2002 | Nakamura ........ G02F 1/133526 349/95 |
| 2005/0127832 A1 | 6/2005 | Toguchi et al. |
| 2005/0174511 A1 | 8/2005 | Sugawara et al. |
| 2007/0153377 A1 | 7/2007 | Goto |
| 2008/0137222 A1 | 6/2008 | Park et al. |
| 2009/0040440 A1 | 2/2009 | Park |
| 2010/0171424 A1 | 7/2010 | Kimura |
| 2011/0198654 A1 | 8/2011 | Naya |
| 2011/0200293 A1* | 8/2011 | Zhang .................... B82Y 20/00 385/131 |
| 2011/0233476 A1 | 9/2011 | Arsenault |
| 2011/0278548 A1 | 11/2011 | Takezoe et al. |
| 2012/0098421 A1 | 4/2012 | Thompson |
| 2012/0286258 A1 | 11/2012 | Naraoka et al. |
| 2014/0157286 A1 | 6/2014 | Brazier |
| 2014/0175404 A1 | 6/2014 | Shim et al. |

FOREIGN PATENT DOCUMENTS

| | | |
|---|---|---|
| JP | 2001264520 A | 9/2001 |
| JP | 2006343711 A | 12/2006 |
| JP | 2007149527 A | 6/2007 |
| JP | 2010097873 A | 4/2010 |
| JP | 2010205511 A | 9/2010 |
| JP | 2010245056 A | 10/2010 |
| JP | 2011081916 A | 4/2011 |
| JP | 2012079438 A | 4/2012 |
| JP | 2012512518 A | 5/2012 |
| KR | 20080090945 A | 10/2008 |
| KR | 10-2009-0062003 | 6/2009 |
| KR | 100922892 B1 | 10/2009 |
| KR | 10-0970832 B1 | 7/2010 |
| KR | 20100120357 A | 11/2010 |
| KR | 20110009647 A | 1/2011 |
| KR | 20110031645 A | 3/2011 |
| KR | 20110103303 A | 9/2011 |
| KR | 20120127897 A | 11/2012 |

OTHER PUBLICATIONS

Korean Office Action, dated Sep. 21, 2015, for Korean Patent Application No. 10-2013-0063113.
Korean Office Action, dated Mar. 31, 2015, for application No. 10-2013-0084967 (with English translation).
Korean Office Action, dated May 15, 2015, for Korean application No. 10-2013-0063113 (with English translation).
Extended European Search Report dated Jul. 15, 2016 issued in corresponding European Patent Application No. 13199083.0.

* cited by examiner

OPTICAL FILMS FOR REDUCING COLOR SHIFT AND ORGANIC LIGHT-EMITTING DISPLAY APPARATUSES EMPLOYING THE SAME

CROSS-REFERENCE TO RELATED APPLICATIONS

This application is a continuation of U.S. patent application Ser. No. 14/089,228, filed on Nov. 25, 2013, which claims the benefit of Korean patent applications No. 10-2012-0151338, filed on Dec. 21, 2012, and No. 10-2013-0064967, filed on Jun. 5, 2013, in the Korean Intellectual Property Office, the disclosures of each of which are incorporated herein by reference in their entirety.

BACKGROUND

1. Field

The present disclosure relates to optical films for reducing color shift and/or organic light-emitting display apparatuses employing the same.

2. Description of the Related Art

An organic light-emitting diode (OLED) includes an anode, an organic light-emitting layer, and a cathode. Here, when a voltage is applied between the anode and the cathode, holes are injected from the anode into the organic light-emitting layer, whereas electrons are injected from the cathode into the organic light-emitting layer. At this point, the holes and electrons injected into the organic light-emitting layer are re-combined and generate excitons, and light is emitted as the excitons transit from an excited state to a ground state.

Because a light-emitting body of such an OLED is an organic material, lifespan deterioration is the core problem regarding the development of OLED, and many techniques are being focused to resolve the problem.

From among the techniques, a technique using a microcavity structure is a technique for increasing an intensity of a light of a particular wavelength by resonating the light and emitting the light of the particular wavelength to outside. In other words, the microcavity structure is a structure in which distances between anodes and cathodes are designed to respectively correspond to representative wavelengths of red (R), green (G), and blue (B), so that only light of wavelengths corresponding thereto resonate and are emitted, and lights of other wavelengths are weakened. As a result, light emitted outside of the structure becomes more intense and sharper, thereby improving brightness and color purity. Furthermore, increased brightness causes reduced power consumption, thereby inducing increased lifespan.

However, in a microcavity structure, wavelengths to be amplified are determined based on a thickness of an organic deposition material layer. Here, a length of a light path changes at lateral sides, thereby causing an effect similar to a change in the thickness of an organic deposition material layer. Therefore, the wavelengths to be amplified are changed.

In other words, as the viewing angle is tilted from the front to a side, the maximum resolution wavelength becomes shorter, and thus a color shift occurs as the maximum resolution wavelength decreases. For example, even if white color is embodied at the front, the white color may become bluish at a lateral side due to blue shift phenomenon.

SUMMARY

Provided are optical films for reducing color shift and/or organic light-emitting display apparatuses employing the same.

According to some example embodiments, an optical film includes a high refractive index pattern layer including a first surface and a second surface facing each other, wherein the first surface includes a pattern having a plurality of grooves, the plurality of grooves each have a curved surface, and a depth greater than a width thereof, and the high refractive index pattern layer is formed of a material having a refractive index greater than 1; and a low refractive index pattern layer formed of a material having a refractive index smaller than that the refractive index of the material constituting the high refractive index pattern layer, wherein the low refractive index pattern layer includes a filling material for filling the plurality of grooves.

The pattern having a plurality of grooves may be an engraved pattern.

The filling material may be air or a resin material.

The filling material may include a transparent plastic material including a light diffuser or a light absorber.

The low refractive index pattern layer may include a plurality of protrusions constituting a pattern corresponding to the plurality of grooves.

The low refractive index pattern layer may include a transparent plastic material including a light diffuser or a light absorber.

An aspect ratio of each of the grooves may be greater than 1 and smaller than 3, and the aspect ratio may be a ratio between the depth of the groove with respect to the width of the groove.

The plurality of grooves may each have an extended stripe shape.

The plurality of grooves may constitute a dotted pattern from a perspective view with respect to the high refractive index pattern layer.

The curved surface may be an aspheric surface.

A sum of widths of the plurality of grooves may occupy from about 25% to about 50% of a width of the high refractive index pattern layer.

The optical film may further include a first adhesive layer below the low refractive pattern layer.

A circular polarization layer or an anti-reflection layer may be on the high refractive pattern layer.

The optical film may further include a first base layer and a second adhesive layer, wherein the high refractive pattern layer, the first base layer, the second adhesive layer and the circular polarization layer are sequentially arranged.

The circular polarization layer may include a phase converting layer, a linear polarization layer, and a second base layer sequentially arranged on the second adhesive layer.

The first base layer may be between the high refractive pattern layer and the anti-reflection layer.

The optical film may further include a circular polarization layer including a phase converting layer and a linear polarization layer.

The first adhesive layer, the low refractive pattern layer, the high refractive pattern layer, the phase converting layer, the linear polarization layer, the first base layer and the anti-reflection layer may be sequentially arranged.

The optical film may further include a second base layer and a second adhesive layer, wherein the high refractive pattern layer, the second base layer, the second adhesive layer and the phase converting layer are sequentially arranged.

The first base layer and the second base layer may be formed of an optical isotropic material.

The first adhesive layer, the phase converting layer, the linear polarization layer, the low refractive pattern layer, the high refractive pattern layer, the first base layer and the anti-reflection layer may be sequentially arranged.

The linear polarization layer, the second base layer, the second adhesive layer and the low refractive pattern layer may be sequentially arranged.

The first adhesive layer, the phase converting layer, the low refractive pattern layer, the high refractive pattern layer, the linear polarization layer, the first base layer and the anti-reflection layer may be sequentially arranged.

The second base layer may be between the high refractive pattern layer and the linear polarization layer.

The first adhesive layer, the phase converting layer, the linear polarization layer, the first base layer and the low refractive pattern layer may be sequentially arranged.

The optical film may further include a transmittance adjusting layer between the high refractive pattern layer and the anti-reflection layer.

The optical film may further include a first carrier film between the high refractive pattern layer and the transmittance adjusting layer.

The second adhesive layer may be between the first carrier film and the transmittance adjusting layer, and a second carrier film may be between the transmittance adjusting layer and the anti-reflection layer.

The first carrier film may be between the transmittance adjusting layer and the anti-reflection layer.

The second adhesive layer may be between the high refractive pattern layer and the transmittance adjusting layer, and the second carrier film may be between the first adhesive layer and the low refractive pattern layer.

According to other example embodiments, an organic light-emitting display apparatus includes an organic light-emitting display panel including a plurality of pixels emitting light of different wavelengths, and a plurality of organic light-emitting layers each having a microcavity structure configured to resonate and emit light of a corresponding wavelength; and the optical film on the organic light-emitting display panel.

The plurality of grooves may each have an extended stripe shape.

An extending direction of the plurality of grooves may correspond to a vertical direction of the organic light-emitting display panel.

The plurality of pixels may be two-dimensionally arranged along a vertical direction and a horizontal direction of the organic light-emitting display panel, and the extending direction of the plurality of grooves and the vertical direction in which the plurality of pixels are arranged may be non-parallel to each other.

The plurality of grooves may constitute a dotted pattern from a perspective view with respect to the high refractive index pattern layer.

An aspect ratio of each of the plurality of grooves may be greater than 1 and smaller than 3 where the aspect ratio is a ratio between the depth of the groove with respect to the width of the groove.

The curved surface may be an aspheric surface.

A sum of widths of the plurality of grooves may occupy from about 25% to about 50% of a width of the high refractive index pattern layer.

The organic light-emitting display apparatus may further include an adhesive film between the organic light-emitting display panel and the optical film.

The adhesive film may be formed of a pressure sensitive adhesive (PSA) material including a light absorber and a light diffuser.

The organic light-emitting display apparatus may further include a circular polarization layer on the high refractive pattern layer.

The organic light-emitting display apparatus may further include an anti-reflection layer on the high refractive pattern layer.

The organic light-emitting display apparatus may further include a circular polarization layer including a phase converting layer and a linear polarization layer, wherein the circular polarization layer is between the high refractive pattern layer and the anti-reflection layer.

The organic light-emitting display apparatus may further include a transmittance adjusting layer between the high refractive pattern layer and the anti-reflection layer.

A distance between the organic light-emitting layer and the optical film may be less than or equal to about 1.5 mm.

According to still other example embodiments, an optical film includes a refractive layer formed of a first material having a refractive index greater than 1 and a second material having a refractive index smaller than the refractive index of the first material. An interface between the first material and the second material has a pattern with a plurality of grooves. The plurality of grooves each have a curved surface and a depth greater than a width thereof. The second material fills the plurality of grooves.

A tilt angle, $\theta$, of each of the grooves may be between $15° \le \theta \le 75°$ where the tilt angle is an angle between a straight line and the interface, and the straight line connects an apex of each groove to a nearest starting point, along the interface, of an adjacent groove.

The curved surface may have a parabolic shape.

The plurality of grooves may each be defined by two protrusions protruding toward the second material.

BRIEF DESCRIPTION OF THE DRAWINGS

Example embodiments will be more clearly understood from the following detailed description taken in conjunction with the accompanying drawings.

FIG. 1 is an exploded perspective view of an optical film according to some example embodiments;

FIG. 2 is a sectional view taken along a line A-A' of FIG. 1, showing a light path in which light that is perpendicularly incident to the optical film is emitted;

FIG. 3 is a sectional view taken along a line A-A' of FIG. 1, showing a light path in which light that is incident to the optical film at a tilted angle is emitted;

FIG. 4 is a computer simulation graph showing color shift according to a variation of tilt angle $\theta$ in the optical film of FIG. 1;

FIG. 5 is a computer simulation graph showing transmittance and color shift according to a variation of pattern density in the optical film of FIG. 1;

FIG. 6 is a schematic exploded perspective view of an optical film according to other example embodiments;

FIG. 7 is a schematic exploded perspective view of an optical film according to yet other example embodiments;

FIG. 8 is a schematic exploded perspective view of an optical film according to further example embodiments;

FIG. 9 is a schematic sectional view of an optical film according to still further example embodiments;

FIG. 10 is a schematic exploded perspective view of an optical film according to yet still other example embodiments;

FIGS. 11 through 17 are schematic sectional views of optical films according to example embodiments employing circular polarization layers and anti-reflection layers;

FIGS. 18 through 21 are schematic sectional views of optical films according to example embodiments employing transmittance adjusting layers and anti-reflection layers;

FIG. 22 is a sectional view of an organic light-emitting display apparatus according to some example embodiments;

FIG. 23 schematically shows a relationship between arrangement of an adhesive layer and pixel arrangement of an organic light-emitting display panel in the organic light-emitting display apparatus of FIG. 22;

FIG. 24 is a graph showing a comparison between color shifts according to viewing angles in a case where an optical film according to example embodiments is employed and color shifts according to viewing angles in a conventional optical film;

FIG. 25 is a graph showing a comparison between brightnesses according to viewing angles in a case where an optical film according to example embodiments is employed and brightnesses according to viewing angles in a conventional optical film; and FIG. 26 is a schematic sectional view showing an organic light-emitting display apparatus according to other example embodiments.

DETAILED DESCRIPTION

Figure 1:
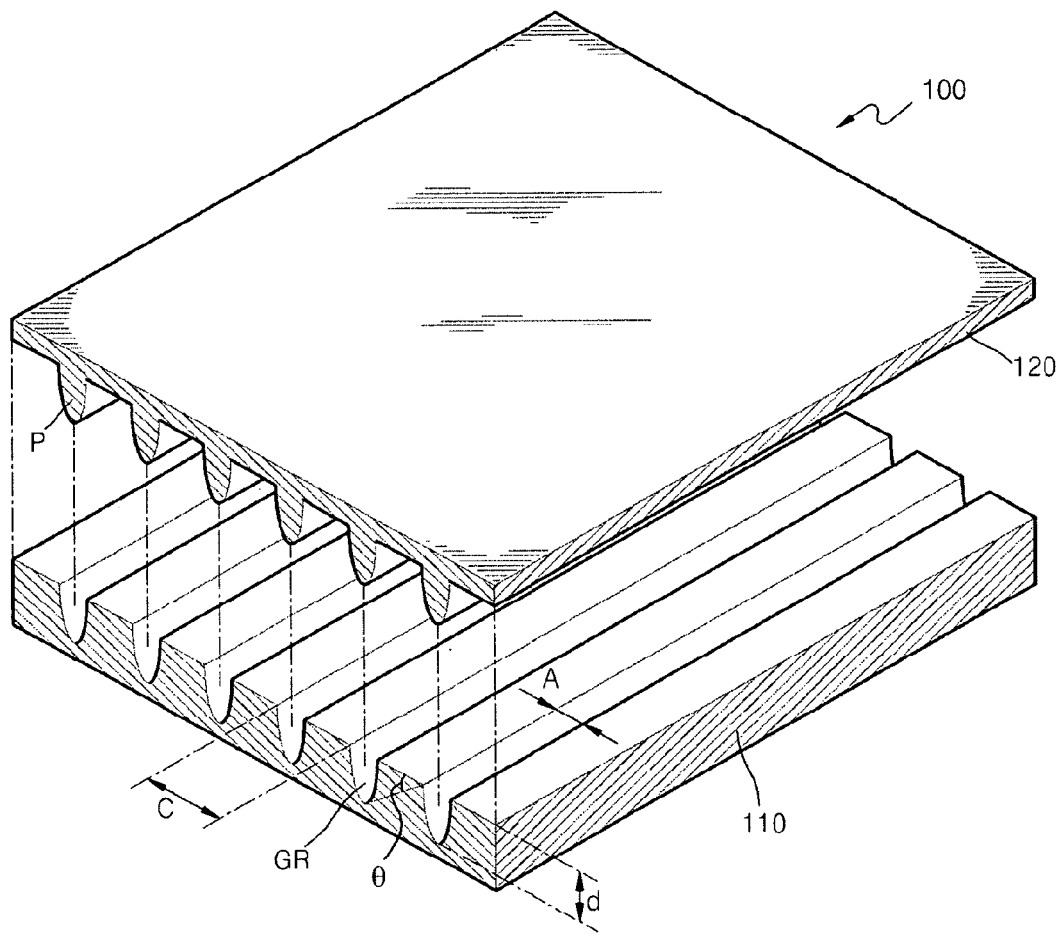
FIGS. 1-26 represent non-limiting, example embodiments as described herein.

Various example embodiments will now be described more fully with reference to the accompanying drawings in which some example embodiments are shown. However, specific structural and functional details disclosed herein are merely representative for purposes of describing example embodiments. Thus, the invention may be embodied in many alternate forms and should not be construed as limited to only example embodiments set forth herein. Therefore, it should be understood that there is no intent to limit example embodiments to the particular forms disclosed, but on the contrary, example embodiments are to cover all modifications, equivalents, and alternatives falling within the scope.

In the drawings, the thicknesses of layers and regions may be exaggerated for clarity, and like numbers refer to like elements throughout the description of the figures.

Although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that, if an element is referred to as being "connected" or "coupled" to another element, it can be directly connected, or coupled, to the other element or intervening elements may be present. In contrast, if an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," if used herein, specify the presence of stated features, integers, steps, operations, elements and/or components, but do not preclude the presence or addition of one or more other features, integers, steps, operations, elements, components and/or groups thereof.

Spatially relative terms (e.g., "beneath," "below," "lower," "above," "upper" and the like) may be used herein for ease of description to describe one element or a relationship between a feature and another element or feature as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, for example, the term "below" can encompass both an orientation that is above, as well as, below. The device may be otherwise oriented (rotated 90 degrees or viewed or referenced at other orientations) and the spatially relative descriptors used herein should be interpreted accordingly.

Example embodiments are described herein with reference to cross-sectional illustrations that are schematic illustrations of idealized embodiments (and intermediate structures). As such, variations from the shapes of the illustrations as a result, for example, of manufacturing techniques and/or tolerances, may be expected. Thus, example embodiments should not be construed as limited to the particular shapes of regions illustrated herein but may include deviations in shapes that result, for example, from manufacturing. For example, an implanted region illustrated as a rectangle may have rounded or curved features and/or a gradient (e.g., of implant concentration) at its edges rather than an abrupt change from an implanted region to a non-implanted region. Likewise, a buried region formed by implantation may result in some implantation in the region between the buried region and the surface through which the implantation may take place. Thus, the regions illustrated in the figures are schematic in nature and their shapes do not necessarily illustrate the actual shape of a region of a device and do not limit the scope.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In order to more specifically describe example embodiments, various features will be described in detail with reference to the attached drawings. However, example embodiments described are not limited thereto.

FIG. 1 is an exploded perspective view of an optical film according to some example embodiments.

Referring to FIG. 1, an optical film 100 includes a high refractive index pattern layer 110 including a plurality of grooves GR having curved surfaces and a low refractive index pattern layer 120 which is formed on the high refractive index pattern layer 110. The low refractive index pattern layer 120 is formed of a material having a lower refractive index than the material constituting the high refractive index pattern layer 110, and includes a filling material for filling the plurality of grooves GR.

The high refractive index pattern layer 110 may be formed of a material having a refractive index greater than 1 (e.g., a transparent plastic material). Furthermore, the optical film 100 may also be formed of a transparent plastic material containing a light diffuser or a light absorbent. The light diffuser may be diffusing beads, and the light absorber may be a black dye, such as carbon black. The light diffuser improves visibility property by flattening peaks that may be induced at color shifts based on angles and brightness profiles by particular grooves. Meanwhile, the light absorber may contribute to improved contrast or color purity by using a dye for selectively absorbing light of a particular wavelength or carbon black for absorbing light of overall visible ray wavelengths.

The groove GR is formed to have an aspect ratio greater than 1. In other words, the groove GR is formed to have a depth d greater than a width w, where the aspect ratio d/w may be greater than 1 and smaller than 3, and the grooves GR may be repeatedly arranged at a set (or, predetermined) cycle C.

In the shape of the grooves GR shown in FIG. 1, a tilt angle θ of the apex of a groove GR with respect to a starting point of an adjacent groove GR may be defined. The tilt angle θ is an angle formed between a straight line, which connects the apex of a groove GR and a starting point of an adjacent groove GR at a top surface of the high refractive pattern layer 110, and the top surface.

The tilt angle θ may be expressed by Equation 1 using depth d, width A, and cycle C of the grooves GR:

$$\theta = \tan^{-1}(d/(C-A/2)) \quad \text{EQUATION 1.}$$

The tilt angle θ defined as shown above may significantly affect performance of the optical film 100, and more particularly, performance for reducing color shift according to an increase in the viewing angle, and may satisfy Equation 2:

$$A/C < 0.5 \quad \text{EQUATION 2.}$$

A surface forming the groove GR is a curved surface and may be an aspheric surface. For example, the curved surface constituting the groove GR may be an elliptical surface, a parabolic surface, or a hyperbolic surface. Furthermore, the grooves G may extend like stripes.

A sum of widths of the plurality of grooves GR may occupy from about 25% to about 50% of a width of the high refractive index pattern layer 110.

As shown in FIG. 1, the low refractive index pattern layer 120 may be formed as a film having protrusions P corresponding to the plurality of grooves GR. In other words, the low refractive index pattern layer 120 has a form which not only fills the plurality of grooves GR, but also includes a flat portion with a set (or, predetermined) thickness. According to materials and methods for filling the grooves GR, a thickness and a flatness of flat portions of the low refractive index pattern layer 120 may vary. Furthermore, the low refractive index pattern layer 120 may be formed of a material having a lower refractive index than the material constituting the high refractive index pattern layer 110. In other words, the low refractive index pattern layer 120 may be formed of a transparent plastic material or a transparent plastic material containing a light diffuser or a light absorber. The light diffuser may be diffusing beads, whereas the light absorber may be a black dye, such as carbon black.

The optical film 100 is for refracting light incident thereto in a direction and emitting the light in any of various other directions based on locations of incidences, where lights are mixed by the optical film 100. Detailed descriptions thereof will be given below with reference to FIGS. 2 and 3.

Figure 2:
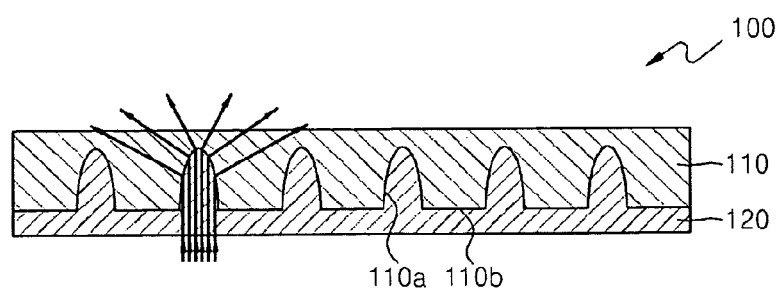
Figure 3:
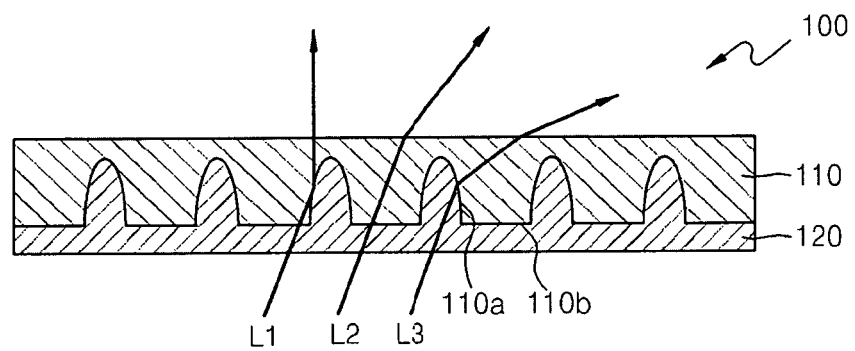

FIG. 2 is a sectional view taken along a line A-A' of FIG. 1, showing a light path in which light that is perpendicularly incident to the optical film is emitted. FIG. 3 is a sectional view taken along a line A-A' of FIG. 1, showing a light path in which light that is incident to the optical film at a tilted angle is emitted.

Referring to FIGS. 2 and 3, the interface between the high refractive index pattern layer 110 and the low refractive index pattern layer 120 includes a curved surface 110a constituting the groove GR and a flat surface 110b, where the curved surface 110a functions as a lens surface.

Referring to FIG. 2, light perpendicularly incident to the optical film 100 is refracted to different directions according to locations at which the light contacts the curved surface 110a and is emitted from the optical film 100. In other words, light beams having a same angle of incidence are refracted to various directions according to respective locations at which the light beams contact the curved surface 110a, and thus light is diffused.

Furthermore, referring to FIG. 3, light beams incident to the optical film 100 at tilted angles are refracted to various directions according to respective locations of incidences of the light beams. In detail, a light beam L1 which is transmitted through the flat surface 110b and contacts the curved surface 110a at the high refractive index pattern layer 110 is totally reflected by the curved surface 110a and is emitted out of the optical film 100. In the light path, an angle at which the light beam L1 is emitted from the top surface of the high refractive index pattern layer 110 is smaller than the angle at which the light beam L1 is incident to the optical film 100. Meanwhile, a light beam L2 which is transmitted through the flat surface 110b without being transmitted through the curved surface 110a is refracted, such that a refraction angle at the interface between the high refractive index pattern layer 110 and outside is greater than the angle of incidence, and thus the light beam L2 is emitted from the optical film 100 at an angle greater than the angle of incidence. Furthermore, a light beam L3 which contacts the curved surface 110a at the low refractive index pattern layer 120 is refracted at the curved surface 110a and is refracted again at the top surface of the high refractive index pattern layer 110, and thus the light beam L3 is emitted from the optical film 100 at a greater angle as compared to the light beam L2 which is transmitted through the flat surface 110b and is emitted from the optical film 100 without contacting the curved surface 110a. As described above, the light beams L1, L2, and L3 that are incident to the optical film 100 at a same tilted angle are emitted from the optical film 100 at different refraction angles according to the respective locations of incidence.

As described above, light that is transmitted through the optical film 100 is a mixture of light beams that are incident to the optical film 100 at various angles.

In the description given above, the detailed light path at which incident light is diffused is merely an example. Light paths may vary according to a difference between refractive indexes of the high refractive index pattern layer 110 and the low refractive index pattern layer 120, an aspect ratio of the groove GR at the high refractive index pattern layer 110, a shape of the curved surface of the groove GR, and an occupation ratio of the groove GR; and a mixture of light or brightness of emitted light may vary based on the light paths.

Due to the light mixing feature, when light beams are incident to the optical film 100 having different optical properties according to angles of incidence, the optical features may be equally mixed of an emitted light. For example, when light beams are emitted out of an OLED, color shifts may occur. In other words, the color properties may slightly vary according to angles of emission. However, after such the light beams are transmitted through the optical film 100 having a structure as described above, the color shifts are mixed, and thus color shifts according to viewing angles may be reduced.

Figure 4:
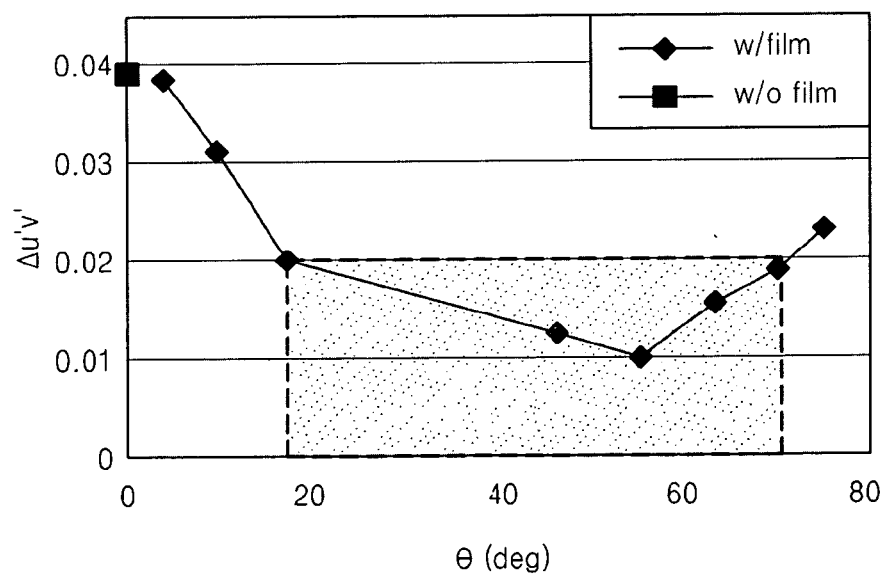

FIG. 4 is a computer simulation graph showing color shift ($\Delta u'v'$) according to a variation of tilt angle $\theta$ in the optical film of FIG. 1.

The computer simulation is performed by using an illumination optical simulation program, and from the result of the simulation on an organic light-emitting device panel including a microcavity structure, the color shifts ($\Delta u'v'$) at a set (or, predetermined) viewing angle are calculated based on front white(x, y)=(0.28, 0.29).

Detailed data shown in the graph is shown below in Table 1.

TABLE 1

| case# | $\theta$ (°) | Width (A) (μm) | Depth (d) (μm) | Cycle (C) (μm) | $\Delta u'v'$ |
|---|---|---|---|---|---|
| 1 | 3.95 | 10 | 2 | 34 | 0.0384 |
| 2 | 9.78 | 10 | 5 | 34 | 0.031 |
| 3 | 17.24 | 10 | 9 | 34 | 0.02 |
| 4 | 46.22 | 10 | 24 | 28 | 0.0125 |
| 5 | 55.3 | 10 | 26 | 23 | 0.0098 |
| 6 | 63.43 | 10 | 36 | 23 | 0.0156 |
| 7 | 69.4 | 10 | 12 | 9.5 | 0.019 |
| 8 | 74.5 | 10 | 36 | 15 | 0.023 |

Referring to the graph shown in FIG. 4, as the tilt angle $\theta$ increases, the color shift ($\Delta u'v'$) decreases and increases again. In other words, the color shift ($\Delta u'v'$) decreases until a particular tilt angle $\theta$, which is about 60°, and the color shift ($\Delta u'v'$) increases again when the tilt angle $\theta$ exceeds the particular tilt angle $\theta$.

It seems that the reason for the increase in the color shift ($\Delta u'v'$) is diffusion, which becomes subtle as the tilt angle $\theta$ exceeds a set (or, predetermined) value. In other words, as described above with reference to FIG. 3, while it is necessary for light beams, e.g., a light beam L1, a light beam L2, and a light beam L3, to be suitably mixed to decrease the color shift, a percentage of a light beam (like the light beam L3) decreases.

Overall, the color shift graph exhibits a V-like shape around a particular angle. Generally, it is known, that, when a lateral side color shift is less than about 0.02, human eyes can barely recognize the color shift. Therefore, a range between 15°<$\theta$<75°, or 15°≤$\theta$≤75°, for example, may be effective for improving color shift. Furthermore, the greater the $\theta$ is, the more difficult manufacturing process may become. Therefore, a range between 15°<$\theta$<65°, or 15°≤$\theta$≤65°, may be employed in consideration of difficulties in manufacturing process.

Figure 5:
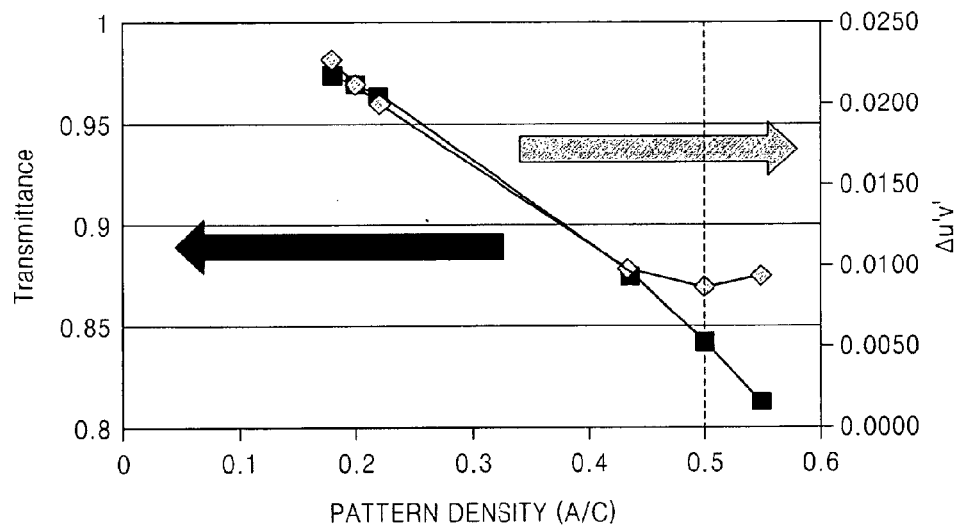

FIG. 5 is a computer simulation graph showing transmittance and color shift ($\Delta u'v'$) according to change of pattern density in the optical film of FIG. 1.

Detailed data shown in the graph is shown below in Table 2.

TABLE 2

| case# | A/C | $\theta$ (°) | Width (A)(μm) | Depth (d)(μm) | Cycle (C)(μm) | $\Delta u'v'$ | Transmittance (%) |
|---|---|---|---|---|---|---|---|
| 1 | 0.18 | 55.4 | 9 | 66 | 50 | 0.0227 | 97.5% |
| 2 | 0.2 | 55.7 | 10 | 66 | 50 | 0.0213 | 97% |
| 3 | 0.22 | 55.6 | 11 | 65 | 50 | 0.02 | 96.4% |
| 4 | 0.435 | 55.3 | 10 | 26 | 23 | 0.0098 | 87.6% |
| 5 | 0.5 | 55.7 | 10 | 22 | 20 | 0.087 | 84.3% |
| 6 | 0.55 | 55.4 | 11 | 21 | 20 | 0.093 | 81.3% |

In the graph shown in FIG. 5, the tilt angle $\theta$ is fixed to an angle around 55°, and color shifts and transmittances according to A/C are shown.

When color shift improvement and front transmittance are calculated for each case, color shift decreases as A/C increases and increases again when A/C is about 0.5 as shown in the graph. Furthermore, the front transmittance decreases in a linear fashion as A/C increases. Because the optical film 100 is a film to be arranged in front of a display panel, transmittance below or equal to a particular level is meaningless. Therefore, A/C may be less than or equal to 0.5, at which color shift improvement is slowed down or reversed, to be more effective for improving color shift.

Hereinafter, structures of optical films according to various example embodiments will be described.

Figure 6:
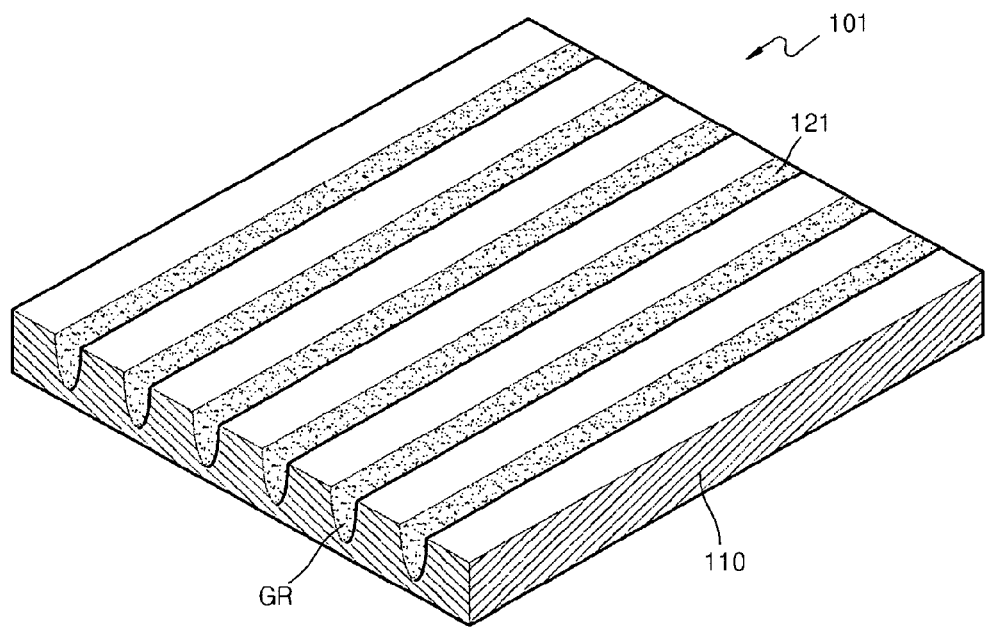

FIG. 6 is a schematic perspective view of an optical film according to other example embodiments.

Referring to FIG. 6, an optical film 101 has a structure in which a plurality of grooves GR including curved surfaces that are engraved, where the depth of the groove GR is greater than the width of the groove GR. The optical film 101 includes the high refractive index pattern layer 110 that is formed of a material having a refractive index greater than 1, and a low refractive index pattern layer 121 that is formed of a material having a refractive index smaller than that of the material constituting the high refractive index pattern layer 110.

The grooves GR may be formed using techniques known in the art. For example, a high refractive index layer (not shown) may be etched using photolithography techniques, wet or dry chemical mechanical polishing or similar techniques.

Compared to the previous example embodiments, the optical film 101 according to the present example embodiments includes the low refractive index pattern layer 121. In other words, compared to the optical film 100 of FIG. 1, instead of arranging the film-type low refractive index pattern layer 120 including protrusions, the grooves GR are filled with a low refractive index material. The low refractive index material may be a resin material or air or another gas medium.

Figure 7:
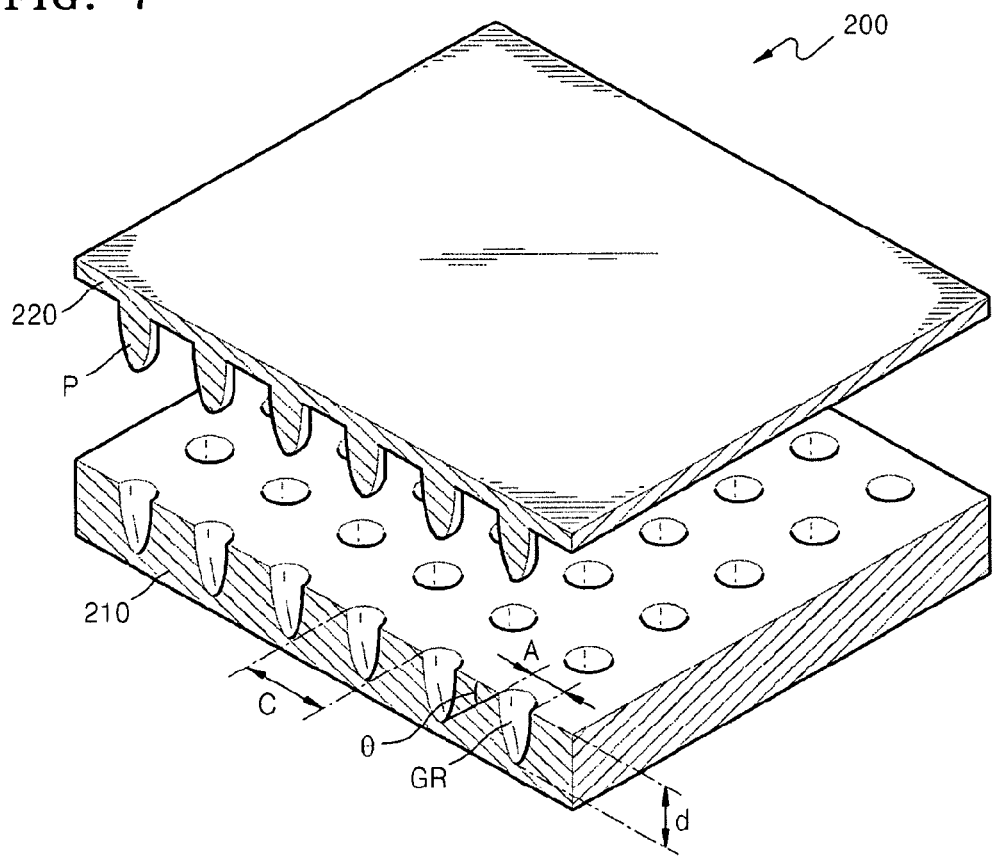

FIG. 7 is a schematic exploded perspective view of an optical film according to yet other example embodiments.

Referring to FIG. 7, an optical film 200 includes a high refractive index pattern layer 210 including a plurality of engraved grooves GR including curved surfaces, and a low refractive index pattern layer 220 which is formed on the high refractive index pattern layer 210. The low refractive index pattern layer 220 is formed of a material having a refractive index smaller than that of the material constituting the high refractive index pattern layer 110, and includes protrusions P constituting a pattern corresponding to the plurality of grooves GR.

The optical film 200 according to the present example embodiments is identical to the optical film 100 of FIG.

except that the grooves GR constitute a dotted pattern from the perspective view with respect to the high refractive index pattern layer 210.

Figure 8:
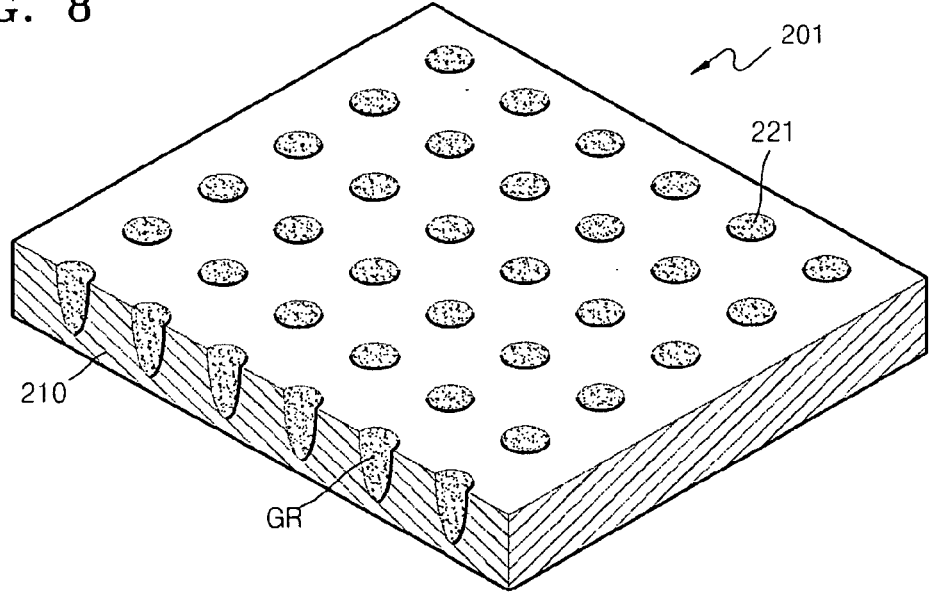

FIG. 8 is a schematic exploded perspective view of an optical film according to further example embodiments.

Referring to FIG. 8, an optical film 201 according to the present example embodiments is identical to the optical film 200 of FIG. 5 except the structure of a low refractive index pattern layer 221. In other words, instead of arranging the film-type low refractive index pattern layer 220 including the protrusions P, the grooves GR constituting a dotted pattern are filled with a low refractive index material, where the low refractive index material may be a resin material or the air.

The optical films 100, 101, 200, and 201 described above may further include anti-reflection layers, circular polarization layers, or transmittance adjusting layers, as well as adhesive layer which may be needed when the optical films are to be applied to an organic light-emitting display apparatus.

Hereinafter, structures of optical films according to example embodiments will be described in detail.

Figure 9:
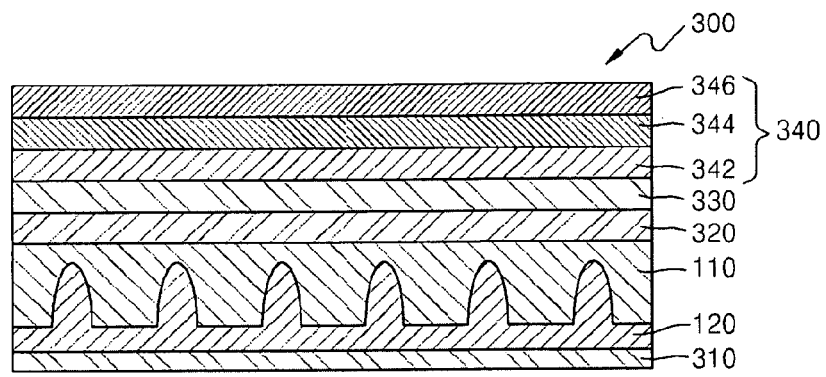

FIG. 9 is a schematic sectional view of an optical film according still further example embodiments.

Referring to FIG. 9, an optical film 300 includes the high refractive index pattern layer 110 and the low refractive index pattern layer 120. The high refractive index pattern layer 110 includes a plurality of grooves GR, whereas the low refractive index pattern layer 120 is formed of a material having a lower refractive index than a material constituting the high refractive index pattern layer 110, and includes a filling material which fills the plurality of grooves GR formed in the high refractive index pattern layer 110. Other than the structure shown in FIG. 7, the structures including the high refractive index pattern layer 210 and the low refractive index pattern layers 121, 220, and 221 may be applied.

Furthermore, a first base 320 may be further formed on the high refractive index pattern layer 110. The first base 320 may be formed of an optically isotropic material, e.g., triacetyl cellulose (TAC).

A circular polarization layer 340 may be further arranged on the first base 320, where the circular polarization layer 340 may include a phase converting layer 342, a linear polarization layer 344, and a second base 346. The second base 346 an optically isotropic material, e.g., triacetyl cellulose (TAC). However, example embodiments are not limited thereto. For example, if a film to be arranged on the first base 320 is not a circular polarization layer, the second base 346 may be formed of PET or PC.

Furthermore, a first adhesive film 330 may be further formed between the first base 320 and the circular polarization layer 340. The first adhesive film 330 may be formed of a pressure sensitive adhesion (PSA) material or a PSA material containing a light absorber or a light diffuser.

Furthermore, a second adhesive film 310 may be further formed on the bottom surface of the low refractive index pattern layer 120. The bottom surface of the low refractive index pattern layer 120 oppose the surface of the low refractive index pattern layer 120 contacting the high refractive index pattern layer 110. The bottom surface of the low refractive index pattern layer 120 becomes the surface that is adhered to an organic light-emitting display panel when the optical film 300 is applied to an organic light-emitting display apparatus. The second adhesive film 310 may be formed of a PSA material containing a light absorber or a light diffuser.

Figure 10:
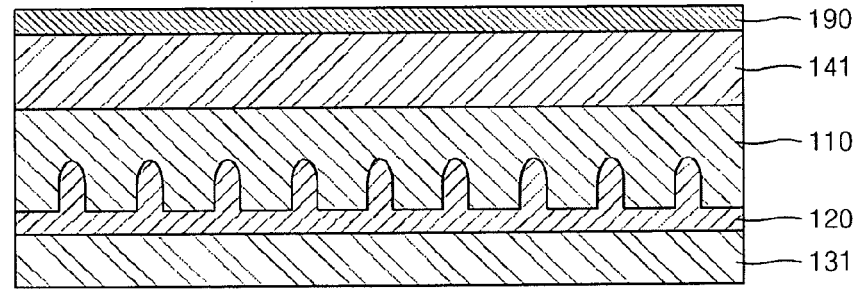

FIG. 10 is a schematic sectional view of an optical film according to yet sill other example embodiments.

Referring to FIG. 10, an optical film 905 has a structure in which an anti-reflection layer 190 is formed on the high refractive pattern layer 110 and a first adhesive layer 131 is formed below the low refractive pattern layer 120, where a first base 141 may be further formed between the high refractive pattern layer 110 and the anti-reflection layer 190.

The anti-reflection layer 190 may have a multi-layer structure in which inorganic materials having different refractive indexes are stacked. For example, the anti-reflection layer 190 may have a double-layer structure including a high refractive layer and a low refractive layer.

The first adhesive layer 131 is a layer for adhesion to an organic light-emitting panel and may be formed of a PSA material or a PSA material containing a light absorber or a light diffuser. Furthermore, the high refractive pattern layer 110 and/or the low refractive pattern layer 120 may be formed of a transparent material containing a light absorber. When materials including light absorbers are applied to various layers constituting an optical film, reflection of ambient light may be reduced, thereby improving visibility.

The first base 141 is used as a base for forming the high refractive pattern layer 110 and the low refractive pattern layer 120, and may be formed of an optical isotropic material, e.g., TAC.

FIGS. 11 through 17 are schematic sectional views of optical films according to example embodiments employing circular polarization layers and anti-reflection layers.

A circular polarization layer may include a phase converting layer 150 and a linear polarization layer 160.

The phase converting layer 150 may be a λ/4 phase difference film.

The linear polarization layer 160 may include a polyvinyl alcohol (PVA) film and may have a stacked structure including a TAC film or any of various other structures. A PVA film is a film for light polarization and may be formed by adsorbing a dichroic dye to a polyvinylalcohol, which is a polymer material.

Figure 11:
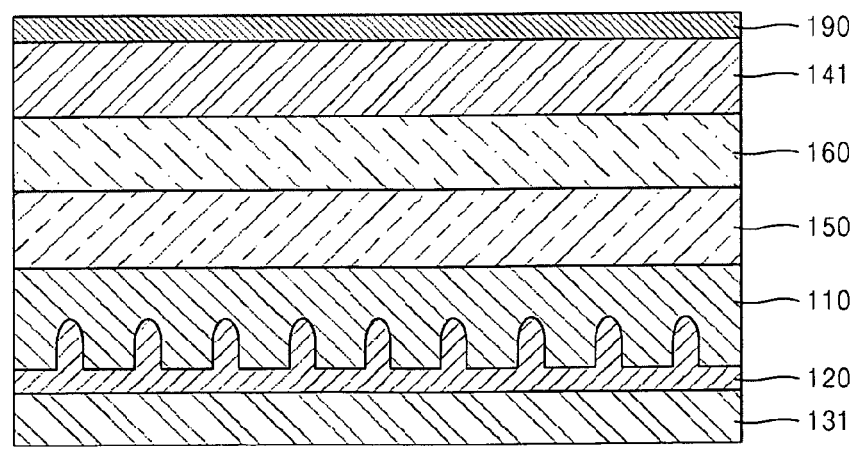
Figure 12:
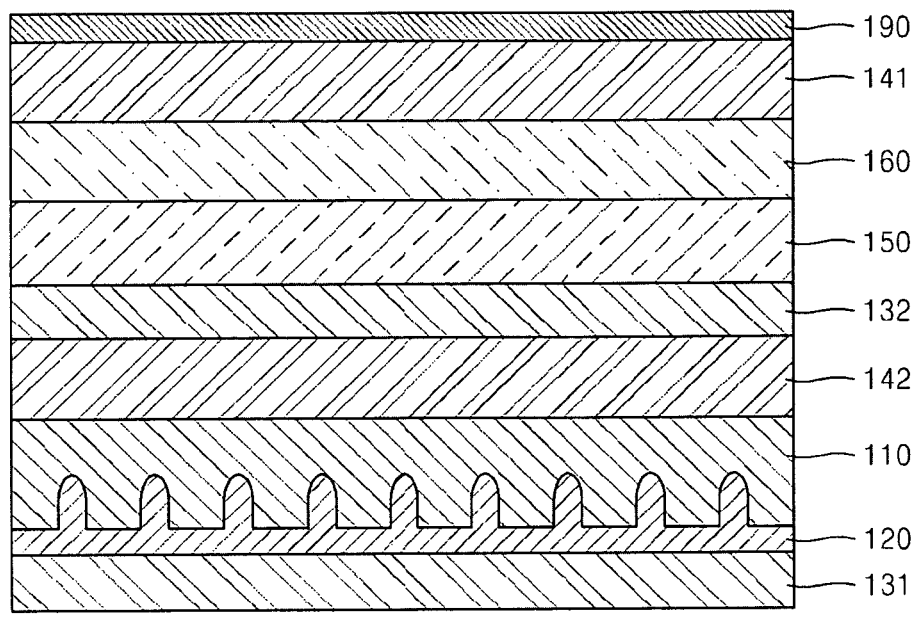

Referring to FIGS. 11 and 12, optical films 906 and 907 includes the adhesive layer 131, the low refractive pattern layer 120, the high refractive pattern layer 110, the phase converting layer 150, the linear polarization layer 160, the first base 141, and the anti-reflection layer 190 that are stacked from below in the order stated.

The circular polarization layer, which includes the phase converting layer 150 and the linear polarization layer 160, increases visibility by reducing reflection of ambient light. When an unpolarized ambient light is incident, ambient light passes through the linear polarization layer 160 and is linearly polarized, and then the linearly polarized light is circularly polarized by the phase converting layer 150. Next, the circularly polarized light passes through the interface between the phase converting layer 150 and the high refractive pattern layer 110, the high refractive pattern layer 110, the low refractive pattern layer 120, and the first adhesive layer 131, and is reflected at the interface between the first adhesive layer 131 and an organic light-emitting panel (not shown), and becomes a circularly polarized light with opposite direction of revolution. Next, this circularly polarized light passes the phase converting layer 150, becomes a linearly polarized light that is perpendicular to the transmittance axis of the linear polarization layer 160, and is not emitted to outside.

As shown in FIGS. 11 and 12, the circular polarization layer is arranged on the high refractive pattern layer 110. Therefore, if the high refractive pattern layer 110 is formed of an anisotropic material having a different optical axis from the circular polarization layer, polarization does not occur, and thus incident outer light may be emitted to outside again. As a result, reflection may significantly increase, and thus visibility may be deteriorated. Therefore, it is necessary to form the high refractive pattern layer 110 using an isotropic material having the same optical axis as the circular polarization layer, e.g., TAC or solvent-casted polycarbonate (PC).

Compared to the optical film 906 of FIG. 11, the optical film 907 of FIG. 12 further includes a second base 142 and a second adhesive layer 132 between the high refractive pattern layer 110 and the phase converting layer 150, where the second base 142 and the second adhesive layer 132 are formed in the order stated from the high refractive pattern layer 110 to the phase converting layer 150.

Figure 13:
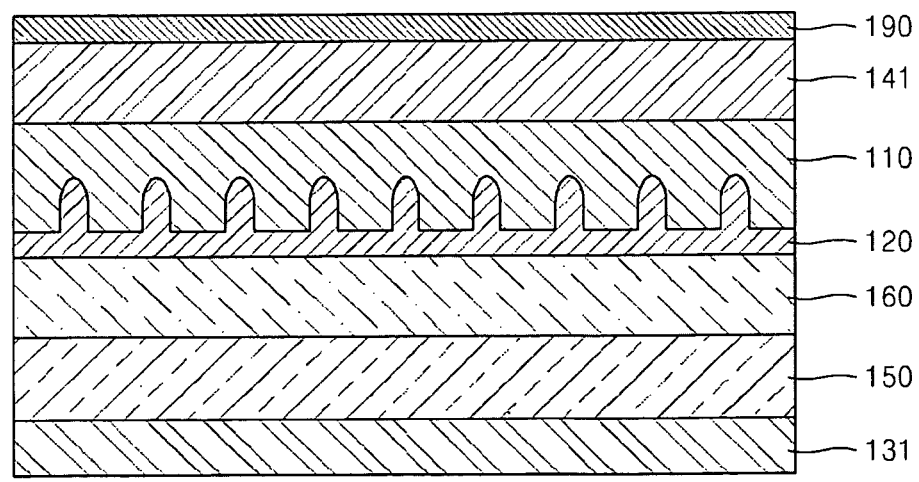
Figure 14:
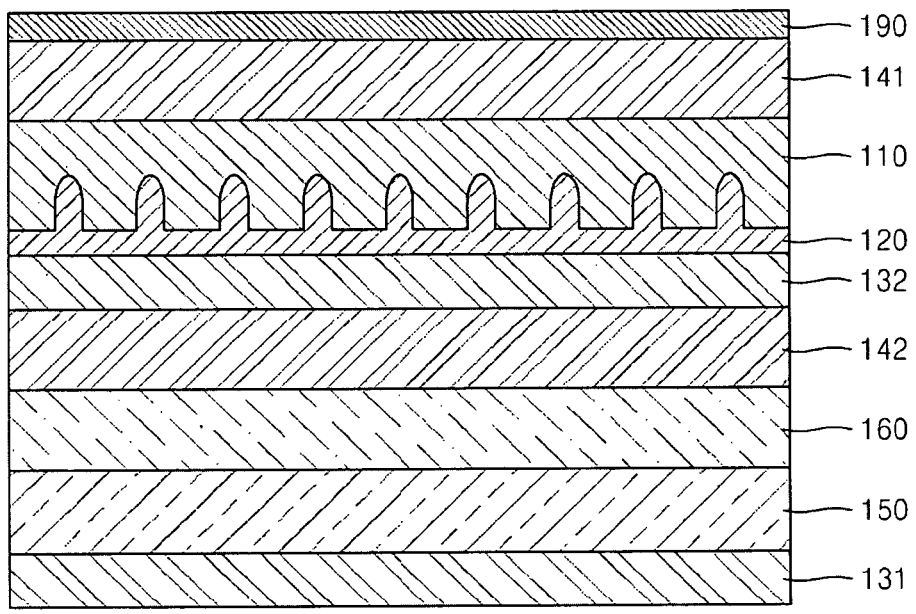

Referring to FIGS. 13 and 14, optical films 908 and 909 include the first adhesive layer 131, the phase converting layer 150, the linear polarization layer 160, the low refractive pattern layer 120, the high refractive pattern layer 110, the first base 141, and the anti-reflection layer 190.

The optical film 909 of FIG. 14 further includes the second base 142 and the second adhesive layer 132 between the linear polarization layer 160 and the low refractive pattern layer 120, where the second base 142 and the second adhesive layer 132 are formed in the order stated from the linear polarization layer 160 to the low refractive pattern layer 120.

Figure 15:
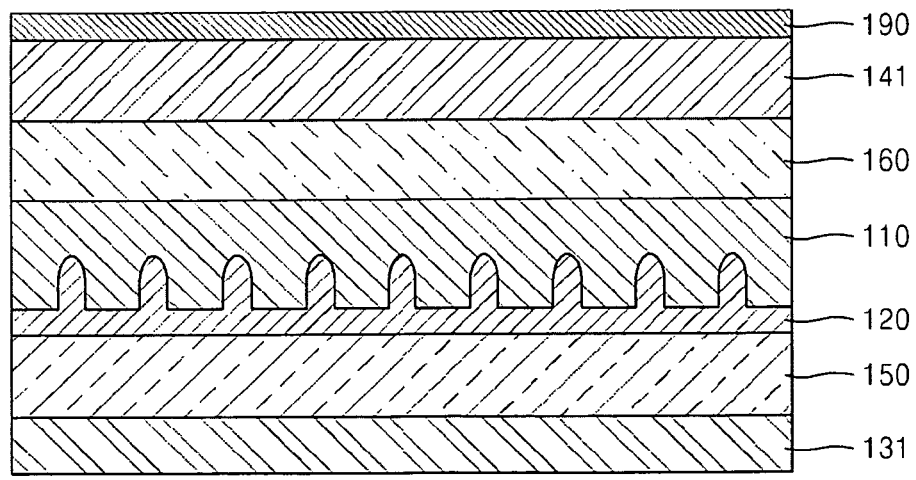
Figure 16:
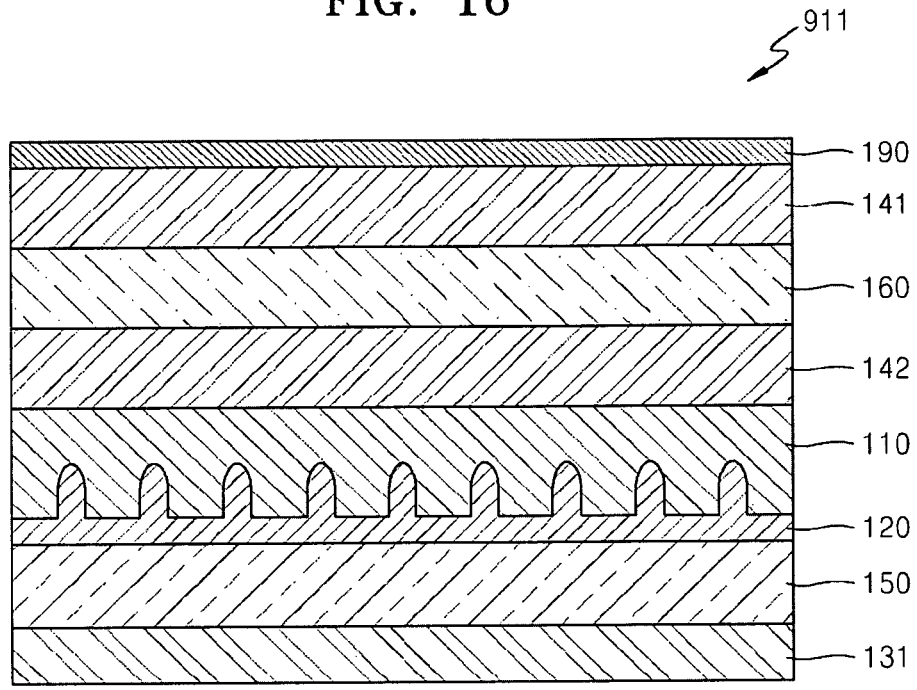

Referring to FIGS. 15 and 16, optical films 910 and 911 include the first adhesive layer 131, the phase converting layer 150, the low refractive pattern layer 120, the high refractive pattern layer 110, the linear polarization layer 160, the first base 141, and the anti-reflection layer 190 that are arranged from below in the order stated.

The optical film 911 of FIG. 16 further includes the second base 142 between the high refractive pattern layer 110 and the linear polarization layer 160.

Figure 17:
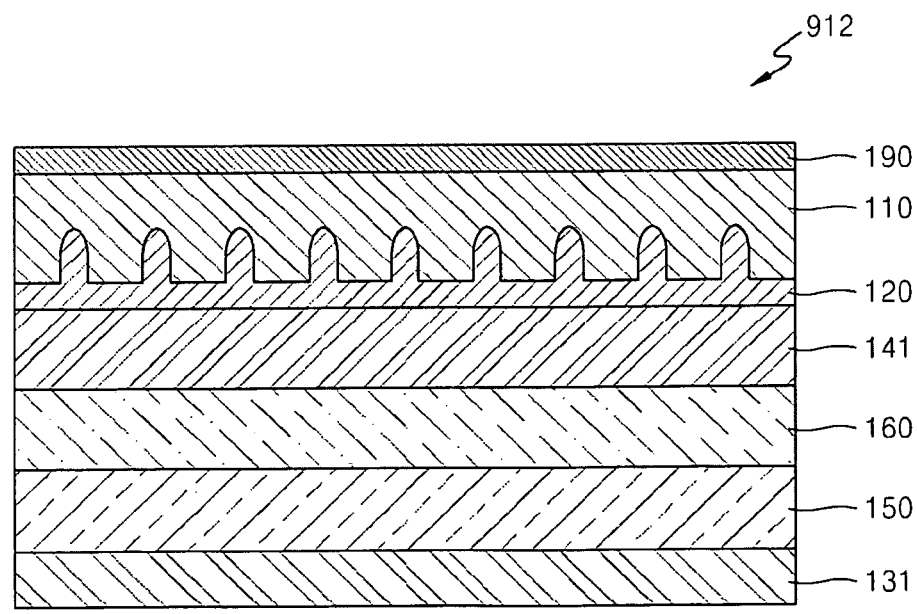

Referring to FIG. 17, an optical film 912 includes the first adhesive layer 131, the phase converting layer 150, the linear polarization layer 160, the first base 141, the low refractive pattern layer 120, the high refractive pattern layer 110, and the anti-reflection layer 190 that are arranged in the order stated.

Figure 18:
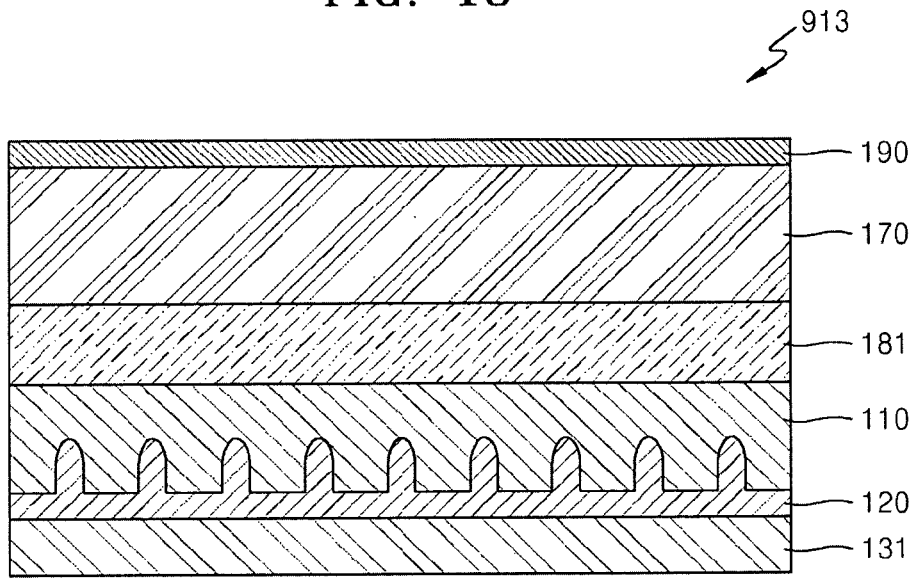
Figure 19:
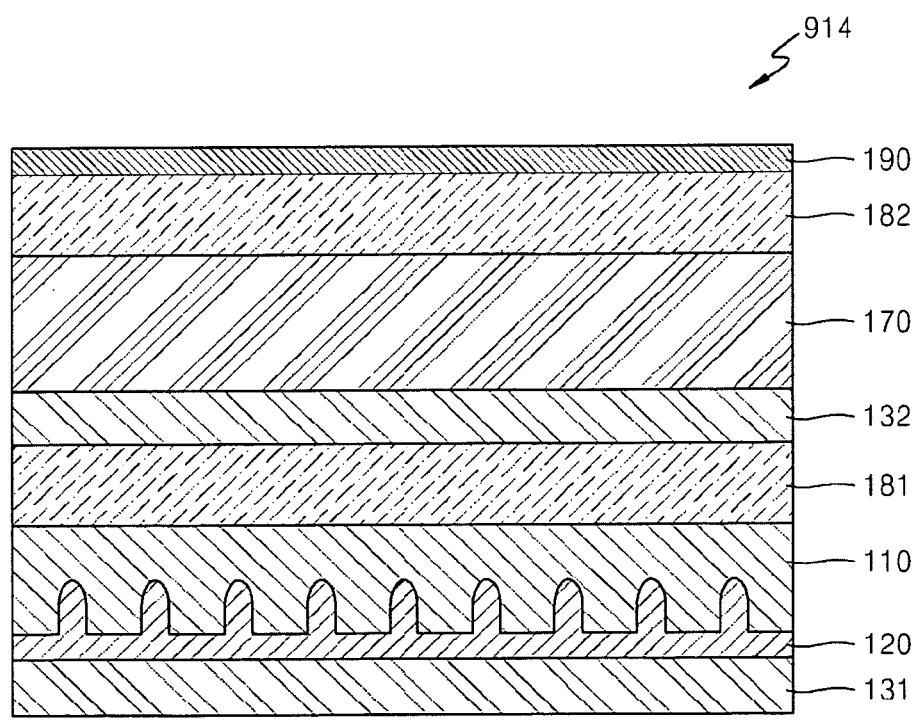
Figure 20:
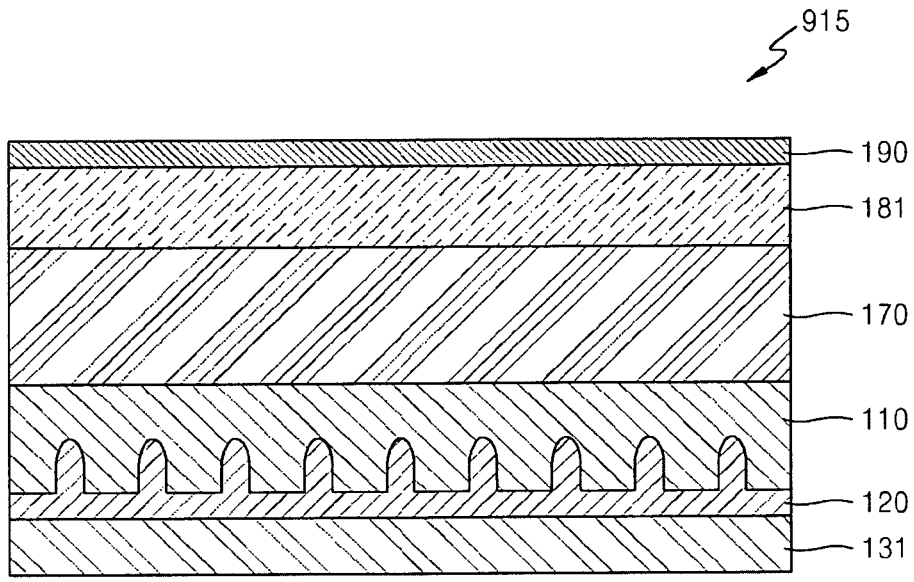

FIGS. 18 through 20 are schematic sectional views of optical films according to example embodiments employing transmittance adjusting layers and anti-reflection layers.

A transmittance adjusting layer 170 may be a film formed by diffusing a black material for absorbing light, e.g., a black dye, a black pigment, carbon black, or particles coated therewith to a polymer resin. The polymer resin may not only be a binder like PMMA, but also a UV curable resin, such as an acrylic resin. However, example embodiments are not limited thereto. Furthermore, a thickness of the transmittance adjusting layer 170, or a concentration of the black material in the polymer resin, may be suitably determined based on the optical properties of the black material. Transmittance of the transmittance adjusting layer 170 may be 40% or higher, which is slightly higher than transmittance of a circular polarization layer. Although a circular polarization layer is capable of almost completely blocking outer light, the circular polarization layer exhibits low transmittance. Therefore, the transmittance adjusting layer 170 is employed.

Referring to FIGS. 18 and 19, optical films 913 and 914 include the first adhesive layer 131, the low refractive pattern layer 120, the high refractive pattern layer 110, a first carrier film 181, the transmittance adjusting layer 170, and the anti-reflection layer 190 that are arranged in the order stated from below.

The optical film 914 of FIG. 19 further includes the second adhesive layer 132 between the first carrier film 181 and the transmittance adjusting layer 170, and a second carrier film 182 between the transmittance adjusting layer 170 and the anti-reflection layer 190.

Figure 21:
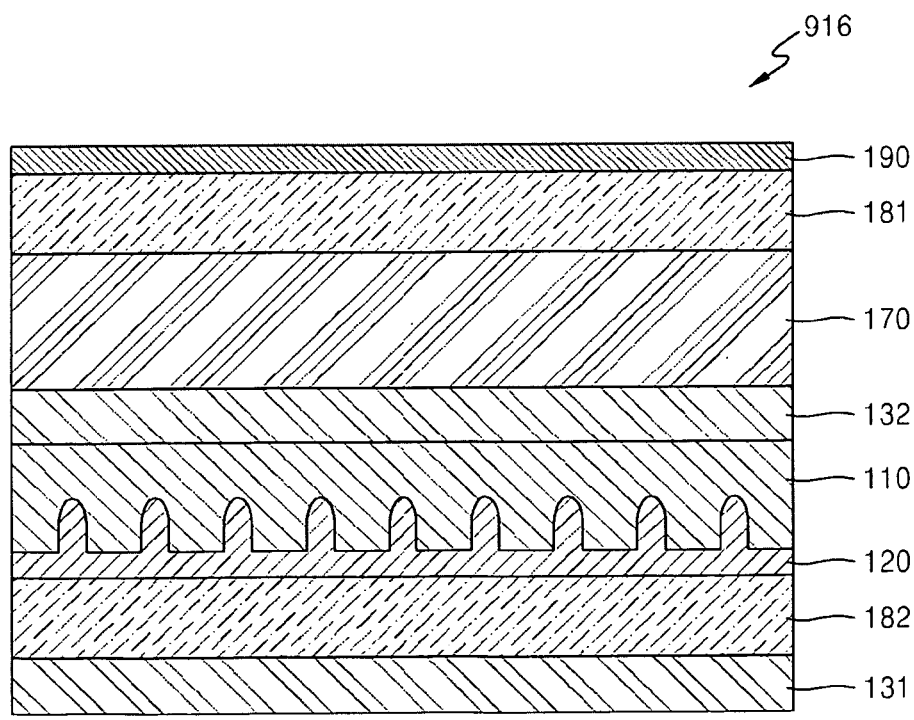

Referring to FIGS. 20 and 21, optical films 915 and 916 include the first adhesive layer 131, the low refractive pattern layer 120, the high refractive pattern layer 110, the transmittance adjusting layer 170, the first carrier film 181, and the anti-reflection layer 190 that are arranged in the order stated from below.

The optical film 916 of FIG. 21 further includes the second adhesive layer 132 between the high refractive pattern layer 110 and the transmittance adjusting layer 170, and the second carrier film 182 between the first adhesive layer 131 and the low refractive pattern layer 120.

The first carrier film 181 and the second carrier film 182 are used as bases for forming the high refractive pattern layer 110 and the low refractive pattern layer 120, or bases for forming the anti-reflection layer 190 and the transmittance adjusting layer 170. Because the optical films of FIGS. 16 through 19 do not include linear polarization layers, the polarization retaining function is not necessary. Therefore, any of various materials including TAC, PET, and PC may be used as the bases.

Although the high refractive pattern layer 110 and the low refractive pattern layer 120 of the optical films 915 and 916 of FIGS. 11 through 21 may have a shape of those shown in FIG. 1, example embodiments are not limited thereto, and the high refractive pattern layer 110 and the low refractive pattern layer 120 may have a shape of those shown in FIGS. 6 through 8.

Figure 22:
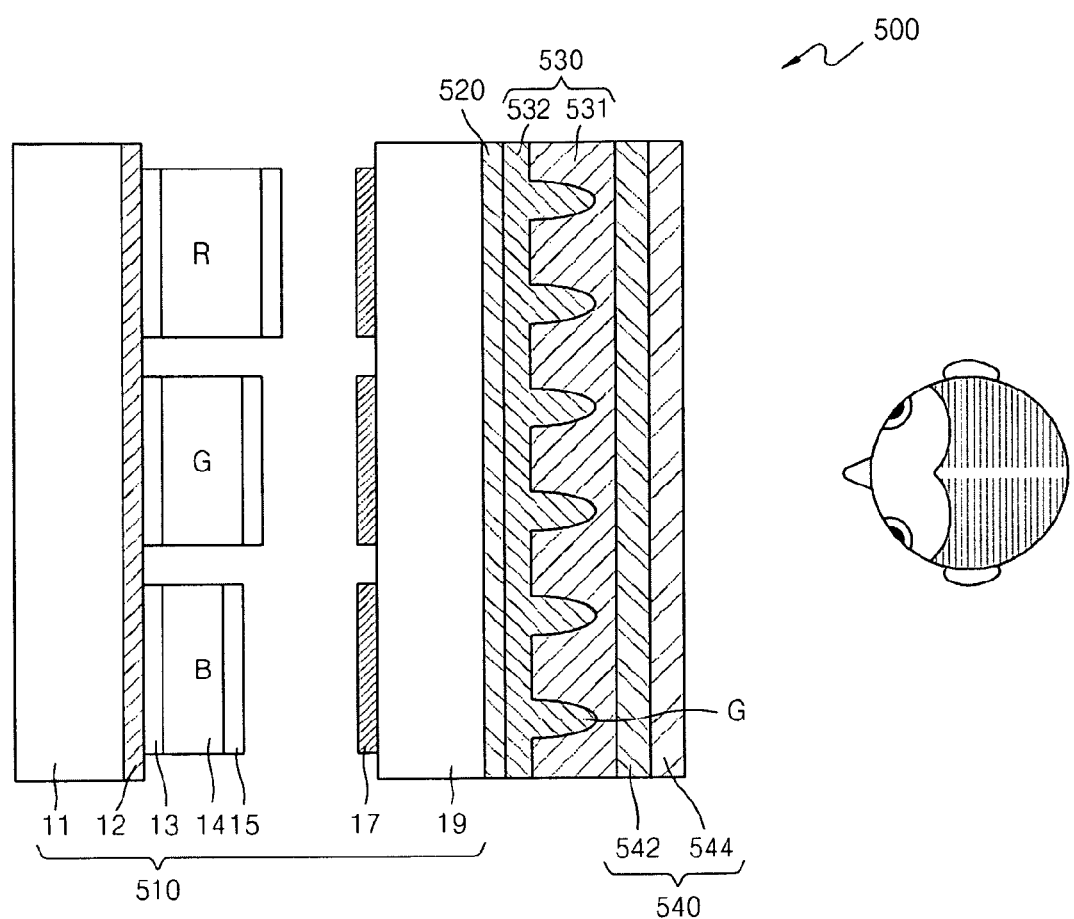
Figure 23:
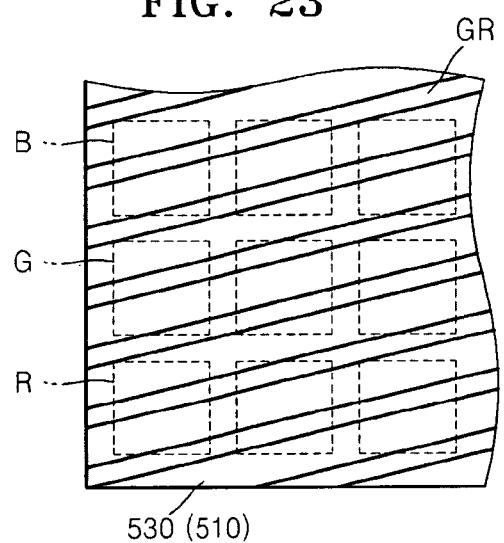

FIG. 22 is a sectional view of an organic light-emitting display apparatus according to some example embodiments, and FIG. 23 schematically shows a relationship between arrangement of an adhesive layer and pixel arrangement of an organic light-emitting display panel in the organic light-emitting display apparatus of FIG. 22.

Referring to FIG. 22, an organic light-emitting display apparatus 500 includes an organic light-emitting display panel 510 including a plurality of pixels which emit light of different wavelengths, and including organic light-emitting layers having a microcavity structure resonating light of the corresponding wavelengths, and the optical film 530 arranged on the organic light-emitting display panel 510. An adhesive layer 520 may be further formed between the organic light-emitting display panel 510 and the optical film 530. Furthermore, a circular polarization layer 540 may be further arranged on the optical film 530.

The organic light-emitting display panel 510 is formed to have a microcavity structure to improve brightness and color purity. In other words, the organic light-emitting display panel 510 includes a plurality of OLEDs each of which emits red light, green light, or blue light, where each of the OLEDs includes anodes 13, an organic light-emitting layer 14, and cathodes 15. As shown in FIG. 7, in the case of the organic light-emitting display panel 510 including OLEDs that are arranged such that an unit pixel embodies red color (R), green color (G), and blue color (B), the organic light-emitting display panel 510 is formed to have a microcavity structure in which the distance between the anode 13 and the cathode 15 of a red OLED corresponding to longer wavelength is the greatest, and the distance between the anode 13 and the cathode 15 of a blue OLED corresponding to shorter wavelength is the shortest. In other words, the organic light-emitting display panel 510 is formed such that distances between the anodes 13 and the cathodes 15 respectively correspond to the representative wavelengths of red color, green color, and blue color. Therefore, only light of corresponding wavelengths are resonated and emitted outside of the organic light-emitting display panel, and light of other wavelengths are weakened.

Detailed descriptions of the organic light-emitting display panel 510 will be given below.

Each sub-pixel of the organic light-emitting display panel 510 may be formed of an OLED which is arranged between a first substrate 11 and a second substrate 19 facing each other and includes the anode 13, the organic light-emitting layer 14, and the cathode 15, and a driving circuit 12, which is formed on the first substrate 11 and is electrically connected to the anode 13, and the cathode 15.

Here, the anode 13 may be formed of an opaque metal, such as aluminum (Al), whereas the cathode 15 may be formed of a transparent electrode, such as indium tin oxide (ITO), or formed as a semi-transparent electrode formed of nickel (Ni) thin-film to transmit light emitted by the organic light-emitting layer 14.

The driving circuit 12 may include at least two thin-film transistor (TFTs) (not shown) and capacitors (not shown) and controls luminance of an OLED by controlling current supplied to the OLED according to data signals.

The driving circuit 12 is a circuit for driving a unit pixel of the organic light-emitting display panel 510 and may include a gate line, a data line perpendicularly crossing the gate line, a switching TFT connected to the gate line and the data line, a driving TFT which is connected to an OLED between the switching TFT and a power line, and a storage capacitor interconnecting a gate electrode of the driving TFT and the power line.

Here, the switching TFT supplies a data signal of the data line to the gate electrode of the driving TFT and the storage capacitor in response to a scan signal from the gate line. In response to the data signal from the switching TFT, the driving TFT controls luminance of an OLED by controlling current supplied from a power line to the OLED. Furthermore, the storage capacitor charges data signals from the switching TFT and supplies charged voltage to the driving TFT, such that the driving TFT is capable of supplying constant current even if the switching TFT is turned off.

The organic light-emitting layer 14 includes a hole injection layer, a hole transport layer, a light-emitting layer, an electron transport layer, and an electron injection layer. Therefore, when a forward voltage is applied between the anode 13 and the cathode 15, electrons move from the cathode 15 to the light-emitting layer via the electron injection layer and the electron transport layer, whereas holes move from the anode 13 to the light-emitting layer via the hole injection layer and the hole transport layer. Next, the electrons and the holes injected into the light-emitting layer are re-combined at the light-emitting layer and generate excitons. Light is emitted from the light-emitting layer as the excitons transit from the excited state to the ground state, where brightness of the emitted light is proportional to a current flowing between the anode 13 and the cathode 15.

Furthermore, the organic light-emitting display panel 510 includes a color filter 17 to improve color efficiency. Here, the color filter 17 is formed on the second substrate 19, where a red color filter is formed in a red sub-pixel region, a green color filter is formed in a green sub-pixel region, and a blue color filter is formed in a blue sub-pixel region. If a unit pixel is embodied to emit light of four colors (red, green, blue, and white), the color filter 17 may be omitted at a white sub-pixel region.

Furthermore, although not shown, a black matrix for preventing light leakage and color mixture may be formed on the second substrate 19 at boundaries between sub-pixels. Furthermore, spacers may be formed for an electrical connection between the anode 13 and the cathode 15 and an electrical connection between the anode 13 and the driving circuit 12, where the electrical connections may be formed by attaching the first substrate 11 and the second substrate 19 toward each other via a sealing member.

Meanwhile, in the organic light-emitting display apparatus 500 having the microcavity structure, the maximum resonating wavelength decreases as viewing angle is tilted, and thus a color shift occurs toward shorter wavelength. For example, even if white color is embodied at the front, the white color may become bluish at a lateral side due to a blue shift phenomenon.

The organic light-emitting display apparatus 500 according to the present example embodiments includes the optical film 530 arranged on the organic light-emitting display panel 510 to reduce the color shift. The optical film 530 includes a high refractive index pattern layer 531 which includes a plurality of engraved grooves GR having curved surfaces and is formed of a material having a refractive index greater than 1, and a low refractive index pattern layer 532 which is formed on the high refractive index pattern layer 531, is formed of a material having a lower refractive index than the material constituting the high refractive index pattern layer 531, and includes a filling material for filling the plurality of grooves GR.

The optical film 530 may have a shape of any of the various optical films 100, 101, 200, and 201 that are described above with reference to FIGS. 1 through 6.

The grooves GR of the optical film 530 may extend like stripes. In this case, the optical film 530 may be arranged on the organic light-emitting display panel 510, such that the stripes extend across the organic light-emitting display panel 510 in a vertical direction. Furthermore, the optical film 530 may be arranged on the organic light-emitting display panel 510, such that an integer number of the grooves GR from among the grooves GR of the optical film 530 correspond to each pixel of the organic light-emitting display panel 510.

As described above with reference to FIGS. 2 and 3, the optical film 530 emits light beams, which are incident thereto at a same angle, at various angles. Meanwhile, light beams emitted by the organic light-emitting display panel 510 have a set (or, predetermined) angle distribution, where color shifting properties slightly vary from one another according to the angles. When such a light beam is transmitted through the optical film 530, light beams incident to the optical film 530 at angles corresponding to relatively great color shift are mixed with light beams incident to the optical film 530 at angles corresponding to relatively small color shift, and thus color shifts based on viewing angles are reduced.

Meanwhile, as shown in FIG. 23, a plurality of pixels R, G, and B of the organic light-emitting display panel 510 may be two-dimensionally arranged at an organic light-emitting display panel in four directions across the organic light-emitting display panel, where the direction in which the stripes formed by the grooves GR extend and the vertical direction in which the plurality of pixels are arranged may not be parallel to each other. If the grooves GR constitute a stripe pattern, a Moire pattern may occurs due to mutual interference between the organic light-emitting display panel 510 and the optical film 530. However, as shown in FIG. 9, if a set (or, predetermined) angle is formed between the direction in which the stripes formed by the grooves GR extend and the vertical direction in which the plurality of pixels are arranged, the occurrence of the Moire pattern may be reduced (or, prevented).

The adhesive layer 520 may be formed between the organic light-emitting display panel 510 and the optical film 530. The adhesive layer 520 may be formed of a PSA material containing a light absorber and a light diffuser, for example.

Furthermore, the low refractive index pattern layer 531 and/or the low refractive index pattern layer 532 may be formed of a transparent material containing a light absorber.

As described above, if a material containing a light absorber is applied to the adhesive layer 520 or the optical film 530, reflectivity of external light may be reduced, thereby improving visibility.

Furthermore, the circular polarization layer 540 may be further arranged on the optical film 530, where the circular polarization layer 540 may include a linear polarization layer 544 and a phase converting layer 542.

The linear polarization layer 544 may include a TAC film and a polyvinyl alcohol (PVA) film. For example, the linear polarization layer 544 may have a TAC film/PVA film/TAC film stacked structure. Structure of the linear polarization layer 544 may further vary. Here, the PVA film is a film for light polarization and may be formed by absorbing a dichroic dye to a PVA, which is a polymer material. Furthermore, the TAC films arranged on the two opposite surfaces of the PVA film support the PVA film.

The phase converting layer 542 may be a λ/4 phase difference film.

The circular polarization layer 540 improves visibility by reducing reflectivity of external light. When external light that is not polarized is incident, the external light is linearly polarized as the external light is transmitted through the linear polarization layer 544 and is circularly polarized by the phase converting layer 542. Next, the circularly polarized light is reflected at the interface between the phase converting layer 542 and the optical film 530 or the interface between the optical film 530 and the organic light-emitting display panel 510 and is circularly polarized in the opposite revolving direction. Next, the circularly polarized light is linearly polarized in a direction perpendicular to the transmitting axis of the linear polarization layer 544 as the circularly polarized light is transmitted through the phase converting layer 542. As a result, the polarized light is not emitted to outside.

As shown in FIG. 22, the circular polarization layer 540 is arranged on the optical film 530. Therefore, if the high refractive index pattern layer 531 constituting the optical film 530 is formed of an anisotropic material having an optical axis different from that of the circular polarization layer 540, polarization may be broken and incident external light may be re-emitted to outside. As a result, reflection of the organic light-emitting display panel 510 may significantly increase, thereby deteriorating visibility of the organic light-emitting display panel 510. Therefore, it is necessary to form the high refractive index pattern layer 531 of a material having the same optical axis as the circular polarization layer 540, e.g., TAC or solvent-casted polycarbonate (PC).

Although FIG. 22 shows that the phase converting layer 542 and the linear polarization layer 544 are formed on the optical film 530 in the order stated. However, the structure is merely an example. For example, the optical film 530 may be arranged between the phase converting layer 542 and the linear polarization layer 544.

Although the optical film 530 is arranged to reduce color shifts according to viewing angles, image distortion may be induced thereby. Therefore, to reduce image distortion as much as possible, a distance between the organic light-emitting layer 14 and the optical film 530 may be less than or equal to about 1.5 mm.

Figure 24:
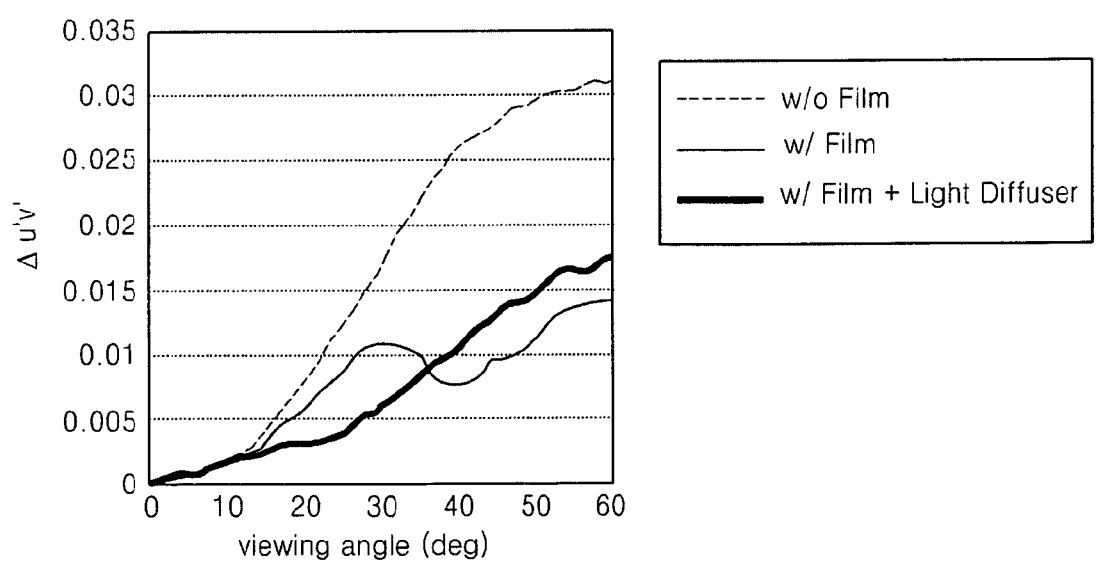

FIG. 24 is a graph showing a comparison between color shifts according to viewing angles in a case where an optical film according to example embodiments is employed and color shifts according to viewing angles in a conventional optical film.

The horizontal axis of the graph indicates viewing angles, whereas the vertical axis of the graph indicates degrees of deviations from reference color coordinates.

Referring to FIG. 24, color shifts according to viewing angles is relatively small in the case where an optical film according to example embodiments is employed. Furthermore, when a light diffuser is also used, apexes corresponding to particular grooves are removed from the graph indicating color shifts according to viewing angles, and thus the graph has a smooth shape.

Figure 25:
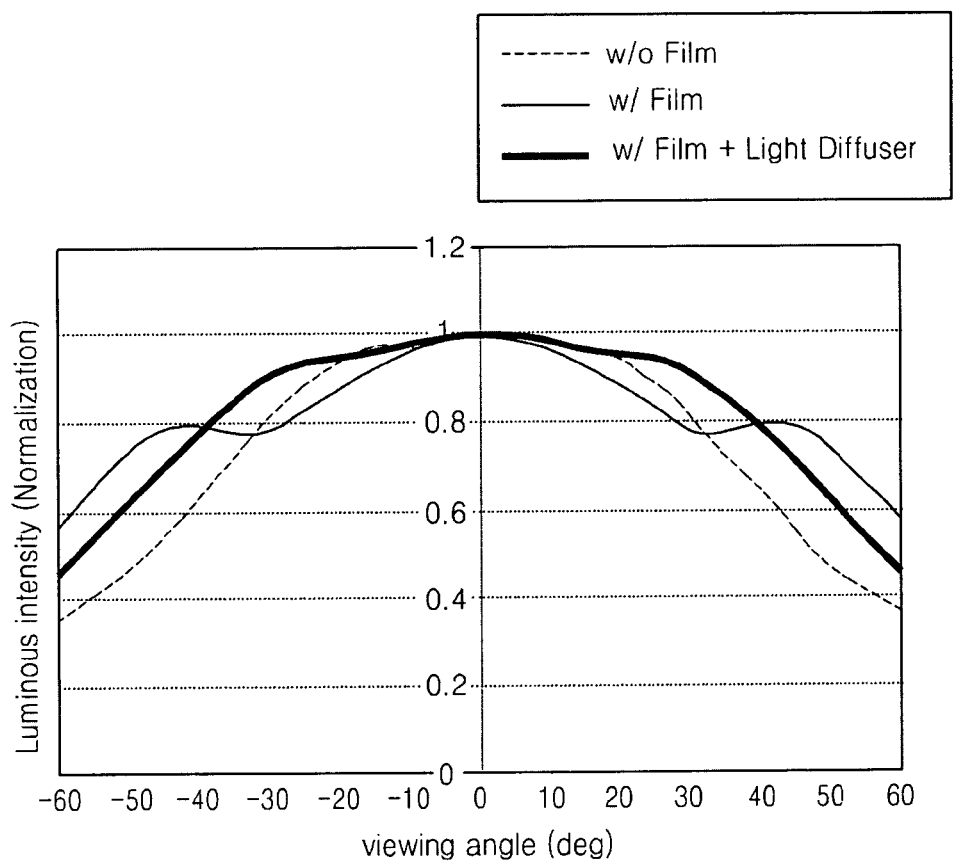

FIG. 25 is a graph showing a comparison between brightnesses according to viewing angles in a case where an optical film according to example embodiments is employed and brightnesses according to viewing angles in a conventional optical film according.

Referring to FIG. 25, brightness distribution corresponding to the case in which the optical film according to example embodiments is employed is similar to brightness distribution corresponding to the case in which the conventional optical film is employed. Furthermore, when a light diffuser is also used, apexes corresponding to particular grooves are removed from the graph indicating brightnesses according to viewing angles, and thus the graph has a smooth shape.

In the graphs shown in FIGS. 24 and 25, the optical film applied to the organic light-emitting display apparatus according to example embodiments barely affects brightness distribution according to viewing angles and reduces color shifts according to viewing angles.

Figure 26:
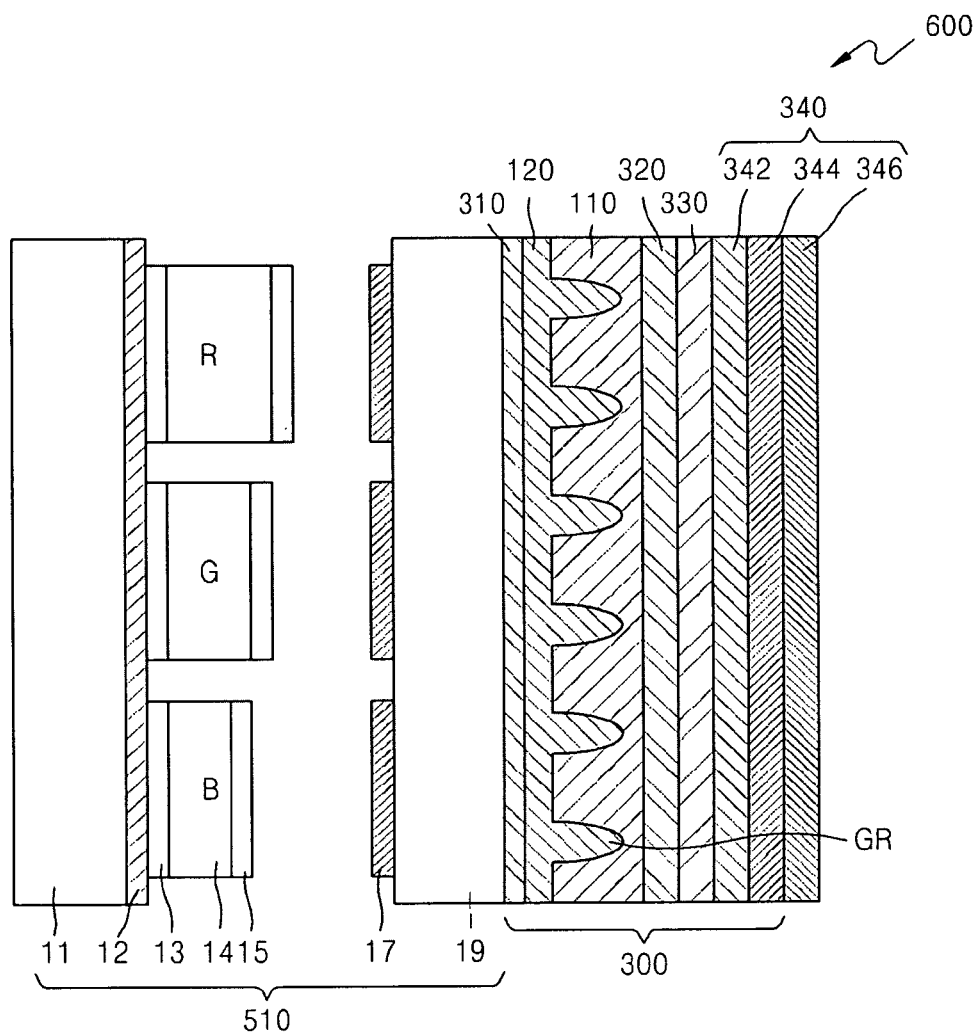

FIG. 26 is a schematic sectional view showing an organic light-emitting display apparatus according to other example embodiments.

Referring to FIG. 26, an organic light-emitting display apparatus 600 includes the organic light-emitting display panel 510 and the optical film 300. The optical film 300 may have the structure shown in FIG. 7. In other words, the optical film 300 may include the adhesive film 310, the low refractive index pattern layer 120, the high refractive index pattern layer 110, the first base 320, the adhesive film 330, and the circular polarization layer 340, where the circular polarization layer 340 may include the phase converting layer 342, the linear polarization layer 344, and the second base 346.

The first base 320 and the second base 346 may be formed of optically isotropic materials, e.g., TAC. The adhesive film 310 and the adhesive film 330 may be formed of PSA material or PSA material containing a light absorber and a light diffuser.

The low refractive index pattern layer 120 and the high refractive index pattern layer 110 may also have the structures as shown in FIGS. 6 through 8.

Although the optical film 300 employed by the organic light-emitting display apparatus 600 has the structure shown in FIG. 9, it is merely an example, and the organic light-emitting display apparatus 600 may employ the optical films 915 through 912 of FIGS. 10 through 21.

The optical film as described above refracts and emits light beams, which are incident thereto at the vertical angle and tilted angles, at various angles.

Therefore, an organic light-emitting display apparatus employing the optical film as described above may include an organic light-emitting layer having a microcavity structure capable of improving color purity. Furthermore, color shifts according to viewing angles may be reduced, and thus high quality images may be provided.

It should be understood that the example embodiments described therein should be considered in a descriptive sense only and not for purposes of limitation. Descriptions of features within each example embodiment should typically be considered as available for other similar features in other example embodiments.

What is claimed is:

1. An optical film, comprising:
a high refractive index pattern layer including a first surface and a second surface facing each other,
wherein the first surface includes a pattern having a plurality of grooves,
the high refractive index pattern layer is formed of a material having a refractive index greater than 1; and
a low refractive index pattern layer formed of a material having a refractive index smaller than the refractive index of the material constituting the high refractive index pattern layer,
wherein the low refractive index pattern layer includes a filling material for filling the plurality of grooves; and
wherein light incident through the low refractive index pattern layer is emitted through the second surface of the high refractive index pattern layer.

2. The optical film of claim 1, wherein the filling material is air or a resin material.

3. The optical film of claim 1, wherein the filling material includes a transparent plastic material including a light diffuser or a light absorber.

4. The optical film of claim 1, wherein the low refractive index pattern layer includes a plurality of protrusions constituting a pattern corresponding to the plurality of grooves.

5. The optical film of claim 4, wherein the low refractive index pattern layer includes a transparent plastic material including a light diffuser or a light absorber.

6. The optical film of claim 1, wherein
an aspect ratio of each of the plurality of grooves is greater than 1 and smaller than 3, and
the aspect ratio is a ratio between a depth of the groove with respect to a width of the groove.

7. The optical film of claim 1, wherein the plurality of grooves each have an extended stripe shape.

8. The optical film of claim 1, wherein the plurality of grooves constitute a dotted pattern from a perspective view with respect to the high refractive index pattern layer.

9. The optical film of claim 1, wherein the plurality of grooves have a curved surface that is aspherical.

10. The optical film of claim 1, wherein a sum of widths of the plurality of grooves occupy from about 25% to about 50% of a width of the high refractive index pattern layer.

11. The optical film of claim 1, further comprising:
a first adhesive layer below the low refractive pattern layer.

12. The optical film of claim 11, further comprising:
a circular polarization layer on the high refractive pattern layer.

13. The optical film of claim 12, further comprising:
a first base layer and a second adhesive layer,
wherein the high refractive pattern layer, the first base layer, the second adhesive layer and the circular polarization layer are sequentially arranged.

14. The optical film of claim 13, wherein the circular polarization layer includes a phase converting layer, a linear polarization layer, and a second base layer sequentially arranged on the second adhesive layer.

15. The optical film of claim 13, further comprising:
an anti-reflection layer on the high refractive pattern layer.

16. The optical film of claim 15, wherein the first base layer is between the high refractive pattern layer and the anti-reflection layer.

17. The optical film of claim 16, further comprising:
a circular polarization layer including a phase converting layer and a linear polarization layer.

18. The optical film of claim 17, wherein the first adhesive layer, the low refractive pattern layer, the high refractive pattern layer, the phase converting layer, the linear polarization layer, the first base layer and the anti-reflection layer are sequentially arranged.

19. The optical film of claim 18, further comprising:
a second base layer and a second adhesive layer;
wherein the high refractive pattern layer, the second base layer, the second adhesive layer and the phase converting layer are sequentially arranged.

20. The optical film of claim 19, wherein the first base layer and the second base layer are formed of an optical isotropic material.

21. The optical film of claim 17, wherein the first adhesive layer, the phase converting layer, the linear polarization layer, the low refractive pattern layer, the high refractive pattern layer, the first base layer and the anti-reflection layer are sequentially arranged.

22. The optical film of claim 21, wherein the linear polarization layer, the second base layer, the second adhesive layer and the low refractive pattern layer are sequentially arranged.

23. The optical film of claim 19, wherein the first adhesive layer, the phase converting layer, the low refractive pattern layer, the high refractive pattern layer, the linear polarization layer, the first base layer and theanti-reflection layer are sequentially arranged.

24. The optical film of claim 23, wherein the second base layer is between the high refractive pattern layer and the linear polarization layer.

25. The optical film of claim 24, wherein the first adhesive layer, the phase converting layer, the linear polarization layer, the first base layer and the low refractive pattern layer are sequentially arranged.

26. The optical film of claim 17, further comprising:
a transmittance adjusting layer between the high refractive pattern layer and the anti-reflection layer.

27. The optical film of claim 26, further comprising:
a first carrier film between the high refractive pattern layer and the transmittance adjusting layer.

28. The optical film of claim 27, wherein
the second adhesive layer is between the first carrier film and the transmittance adjusting layer, and
a second carrier film is between the transmittance adjusting layer and the anti-reflection layer.

29. The optical film of claim 26, wherein the first carrier film is between the transmittance adjusting layer and the anti-reflection layer.

30. The optical film of claim 29, wherein
the second adhesive layer is between the high refractive pattern layer and the transmittance adjusting layer, and
the second carrier film is between the first adhesive layer and the low refractive pattern layer.

31. An organic light-emitting display apparatus, comprising:
an organic light-emitting display panel including a plurality of pixels emitting light of different wavelengths, and a plurality of organic light-emitting layers each having a microcavity structure configured to resonate and emit light of a corresponding wavelength; and
the optical film according to claim 1 on the organic light-emitting display panel.

32. The organic light-emitting display apparatus of claim 31, wherein the plurality of grooves each have an extended stripe shape.

33. The organic light-emitting display apparatus of claim 32, wherein an extending direction of the plurality of grooves corresponds to a vertical direction of the organic light-emitting display panel.

34. The organic light-emitting display apparatus of claim 33, wherein
the plurality of pixels are two-dimensionally arranged along a vertical direction and a horizontal direction of the organic light-emitting display panel, and
the extending direction of the plurality of grooves and the vertical direction in which the plurality of pixels are arranged are non-parallel to each other.

35. The organic light-emitting display apparatus of claim 31, wherein the plurality of grooves constitute a dotted pattern from a perspective view with respect to the high refractive index pattern layer.

36. The organic light-emitting display apparatus of claim 31, wherein
an aspect ratio of each of the plurality of grooves is greater than 1 and smaller than 3, and
the aspect ratio is a ratio between a depth of the groove with respect to a width of the groove.

37. The optical film of claim 1, wherein the first surface further includes flat surfaces between each of the plurality of grooves.

* * * * *